(12) United States Patent
Damiano, Jr. et al.

(10) Patent No.: US 9,324,539 B2
(45) Date of Patent: Apr. 26, 2016

(54) ELECTRON MICROSCOPE SAMPLE HOLDER FOR FORMING A GAS OR LIQUID CELL WITH TWO SEMICONDUCTOR DEVICES

(71) Applicant: PROTOCHIPS, INC., Raleigh, NC (US)

(72) Inventors: John Damiano, Jr., Apex, NC (US); David P. Nackashi, Raleigh, NC (US); Stephen E. Mick, Weimar, TX (US)

(73) Assignee: PROTOCHIPS, INC., Morrisville, NC (US)

( * ) Notice: Subject to any disclaimer, the term of this patent is extended or adjusted under 35 U.S.C. 154(b) by 0 days.

(21) Appl. No.: 14/481,390

(22) Filed: Sep. 9, 2014

(65) Prior Publication Data

US 2015/0162164 A1    Jun. 11, 2015

Related U.S. Application Data

(62) Division of application No. 13/813,818, filed as application No. PCT/US2011/046282 on Aug. 2, 2011, now Pat. No. 8,829,469.

(60) Provisional application No. 61/369,772, filed on Aug. 2, 2010.

(51) Int. Cl.
| | |
|---|---|
| *G21K 5/08* | (2006.01) |
| *H01J 37/20* | (2006.01) |
| *H01J 37/16* | (2006.01) |
| *H01J 37/29* | (2006.01) |

(52) U.S. Cl.
CPC ............... *H01J 37/20* (2013.01); *H01J 37/16* (2013.01); *H01J 37/29* (2013.01); *H01J 2237/2002* (2013.01); *H01J 2237/2003* (2013.01); *H01J 2237/2007* (2013.01)

(58) Field of Classification Search
None
See application file for complete search history.

(56) References Cited

U.S. PATENT DOCUMENTS

| | | | |
|---|---|---|---|
| 2,300,252 A | 12/1940 | Hall | |
| 3,684,453 A | 8/1972 | Lartigue et al. | |
| D258,312 S | 2/1981 | Parker | |
| 4,620,776 A * | 11/1986 | Ima .................. | G02B 21/26 359/391 |
| D290,401 S | 6/1987 | Bjorkman | |
| 4,672,797 A * | 6/1987 | Hagler .................. | G01N 1/28 250/440.11 |
| 5,225,683 A * | 7/1993 | Suzuki ................. | H01J 37/20 250/442.11 |
| 5,367,171 A * | 11/1994 | Aoyama ............... | H01J 37/20 250/442.11 |
| 6,002,136 A * | 12/1999 | Naeem ................. | B82Y 35/00 250/442.11 |

(Continued)

FOREIGN PATENT DOCUMENTS

| | | | |
|---|---|---|---|
| JP | 10185781 A * | 7/1998 | |
| JP | H10185781 A | 7/1998 | |

(Continued)

OTHER PUBLICATIONS

International Search Report, Mar. 13, 2012.

(Continued)

*Primary Examiner* — Andrew Smyth
(74) *Attorney, Agent, or Firm* — Tristan A. Fuierer; Moore & Van Allen, PLLC

(57) ABSTRACT

A novel sample holder for specimen support devices for insertion in electron microscopes. The novel sample holder of the invention allows for the introduction of gases or liquids to specimens for in situ imaging, as well as electrical contacts for electrochemical or thermal experiments.

21 Claims, 24 Drawing Sheets

(56) References Cited

U.S. PATENT DOCUMENTS

| | | | |
|---|---|---|---|
| D449,894 S | 10/2001 | Novitsky et al. | |
| 6,495,838 B1 * | 12/2002 | Yaguchi | H01J 37/20 250/443.1 |
| 7,713,053 B2 | 5/2010 | Mick et al. | |
| 7,767,979 B2 * | 8/2010 | Dona | H01J 37/20 250/442.11 |
| 8,829,469 B2 | 9/2014 | Damiano, Jr. et al. | |
| 2005/0092933 A1 * | 5/2005 | Moriya | H01J 37/20 250/440.11 |
| 2006/0289784 A1 * | 12/2006 | Deguchi | G01N 23/06 250/441.11 |
| 2007/0145289 A1 * | 6/2007 | Chao | H01J 37/20 250/440.11 |
| 2008/0067374 A1 * | 3/2008 | Ono | G01R 31/307 250/310 |
| 2008/0135778 A1 * | 6/2008 | Liu | H01J 37/20 250/440.11 |
| 2008/0179518 A1 * | 7/2008 | Creemer | H01J 37/20 250/311 |
| 2010/0140497 A1 | 6/2010 | Damiano, Jr. et al. | |
| 2010/0143198 A1 | 6/2010 | Damiano, Jr. et al. | |
| 2010/0193398 A1 * | 8/2010 | Marsh | G02B 21/34 206/710 |
| 2011/0032611 A1 | 2/2011 | Mick et al. | |
| 2011/0079710 A1 * | 4/2011 | Damiano, Jr. | H01J 37/20 250/307 |
| 2011/0127427 A1 | 6/2011 | Nackashi et al. | |
| 2011/0248165 A1 | 10/2011 | Damiano, Jr. et al. | |
| 2011/0303845 A1 * | 12/2011 | Yaguchi | H01J 37/20 250/310 |
| 2012/0292505 A1 | 11/2012 | Damiano et al. | |

FOREIGN PATENT DOCUMENTS

| | | | |
|---|---|---|---|
| JP | 10312763 A | * | 11/1998 |
| JP | 2000133186 A | | 5/2000 |
| JP | 2007303946 A | | 11/2007 |
| JP | 2008311214 A | * | 12/2008 |
| JP | 2009117196 A | * | 5/2009 |
| JP | 2009215609 A | * | 9/2009 |
| JP | 2010192126 A | * | 9/2010 |
| JP | 2011129443 A | * | 6/2011 |

OTHER PUBLICATIONS

Japanese Office Action, Apr. 22, 2015.

Supplemental European Search Report, Apr. 28, 2015.

Creemer, J F, et al; "A MEMS Reactor for Atomic-Scale Microscopy of Nanomaterials Under Industrially Relevant Conditions," Journal of Microelectromechanic Systems, 2010, pp. 254-264, vol. 19.

Elisabeth Ariel Ring, "Design and Characterization of a Microfludic System for Scanning Transmission Electron Microscopy," Thesis Submitted to the Faculty of Graduate School of Vanderbilt University in Partial Fulfillment of the Requirements of the Degree of Master of Science in Chemical and Physical Biology, TN, 2010, http://etd.library.vanderbilt.edu/available/etd-06282010-172313/unrestricted/Ring_thesis_Submit.pdf, pp. 12-21, Figures 4-6.

* cited by examiner

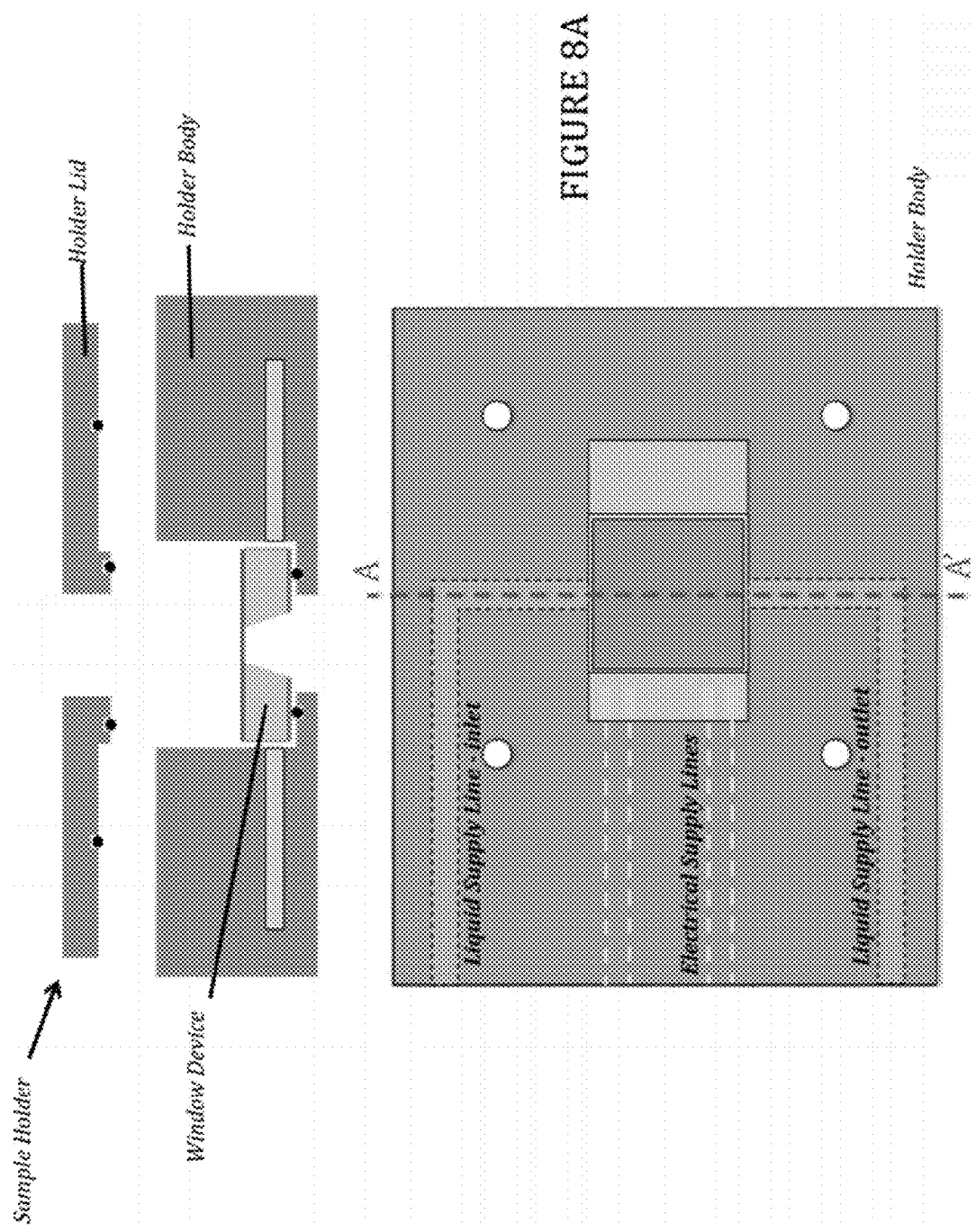

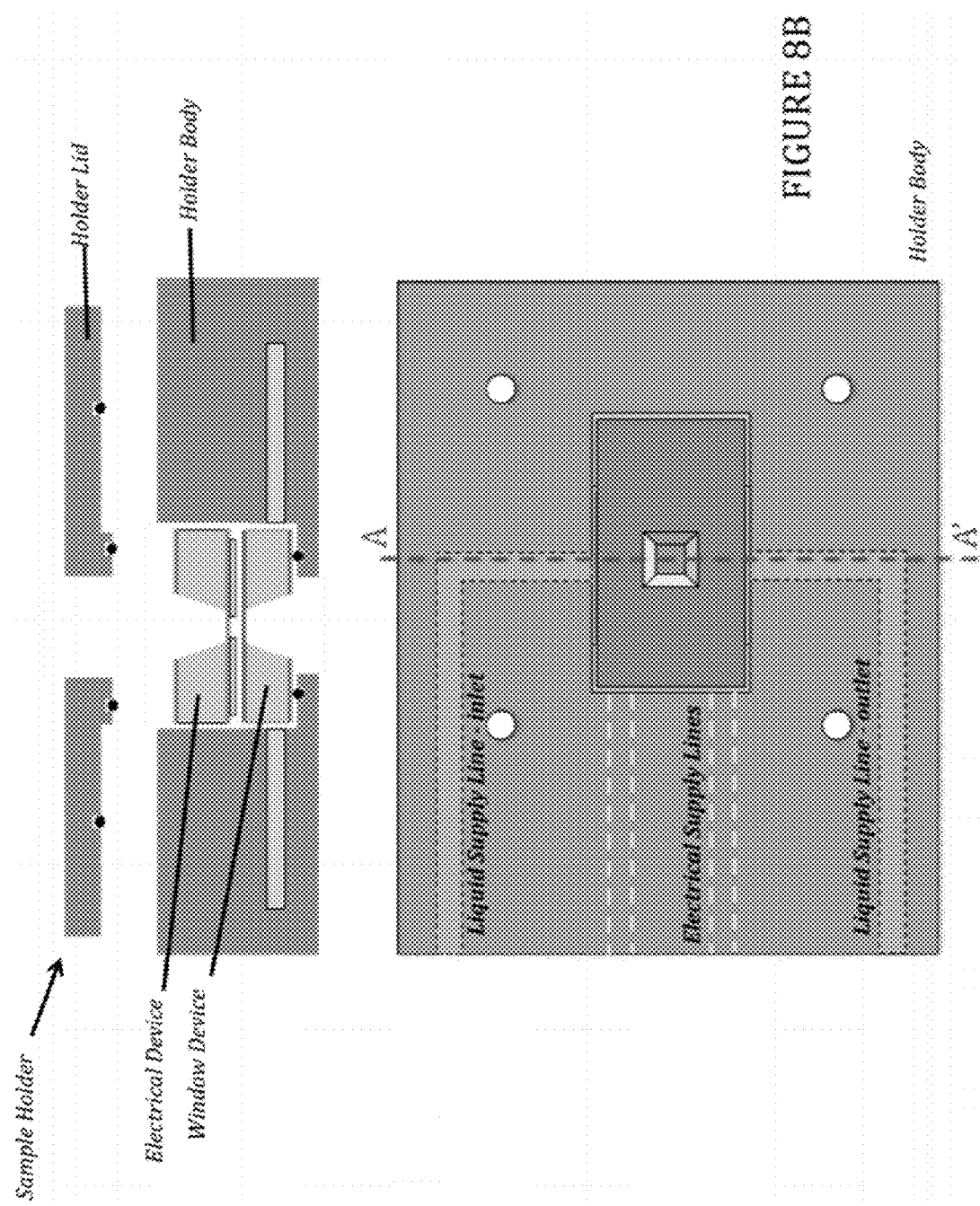

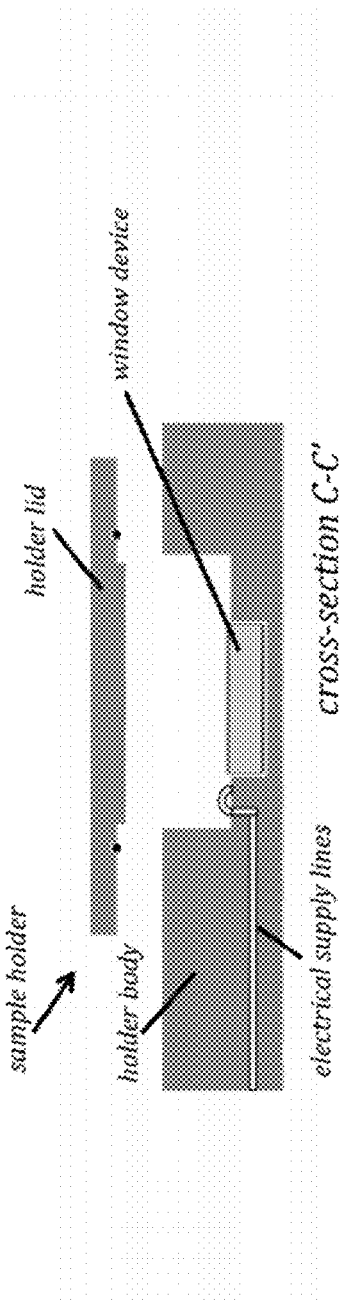
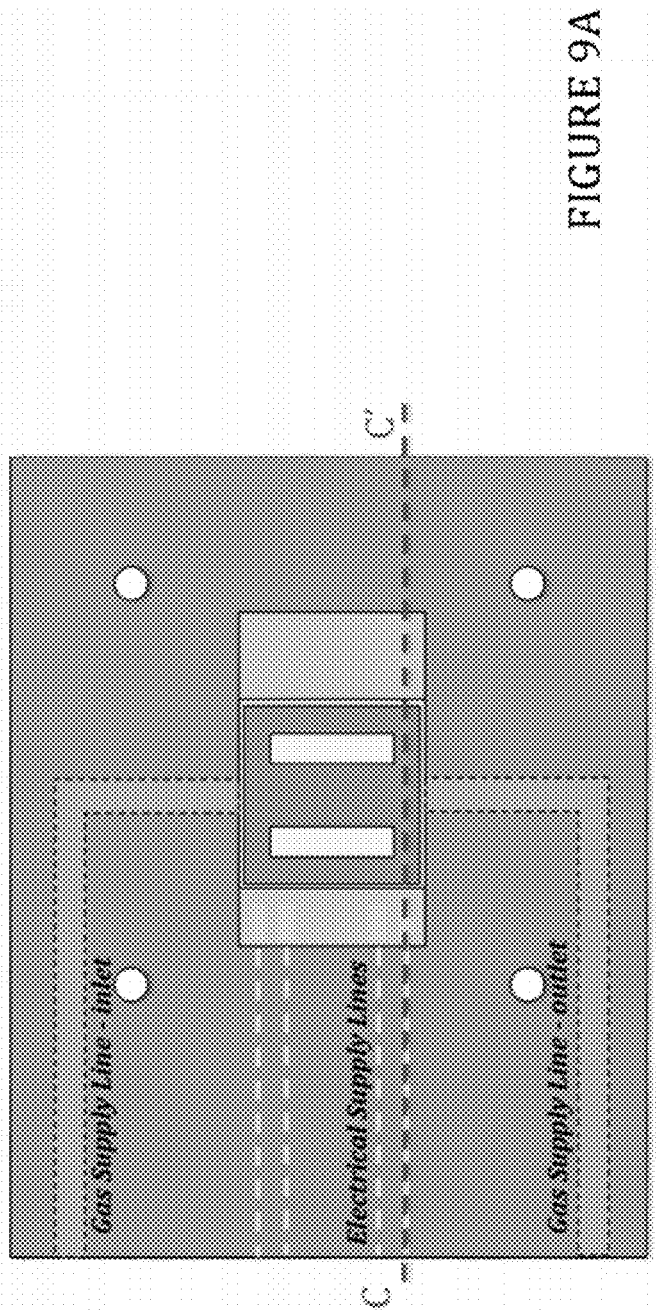
FIGURE 9A

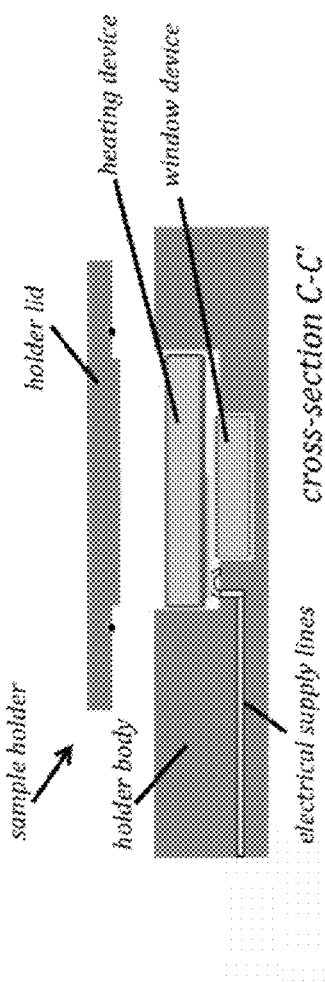
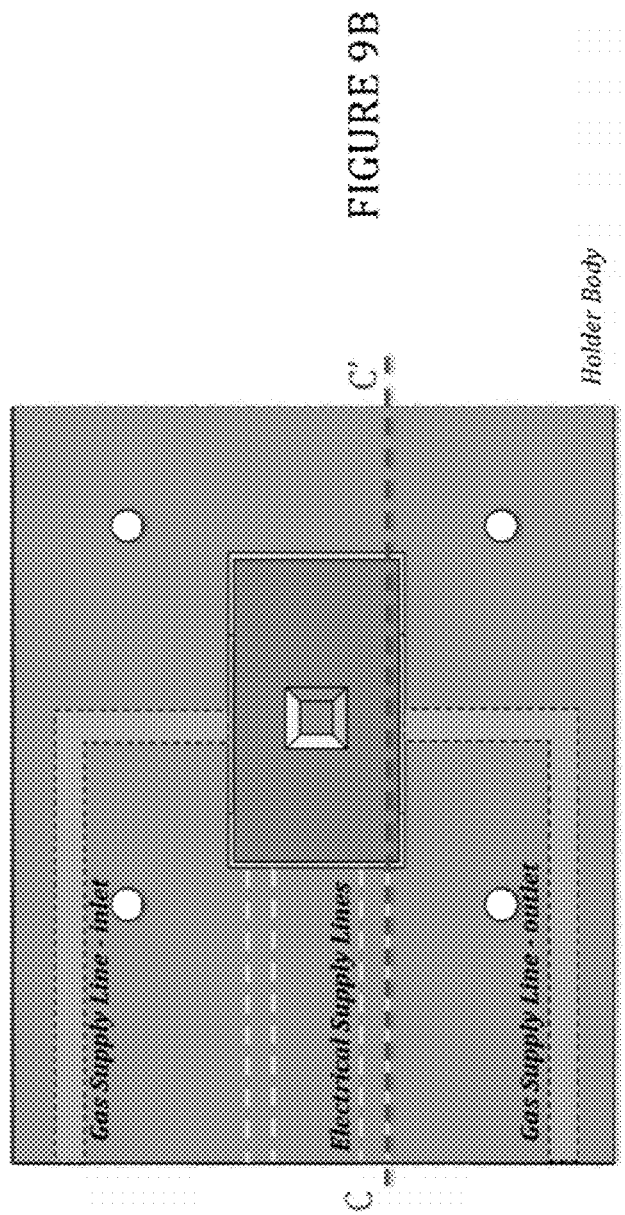
FIGURE 9B

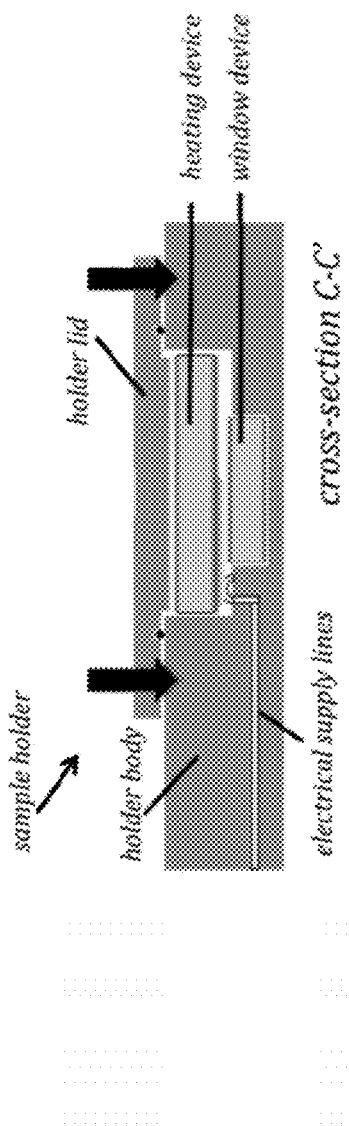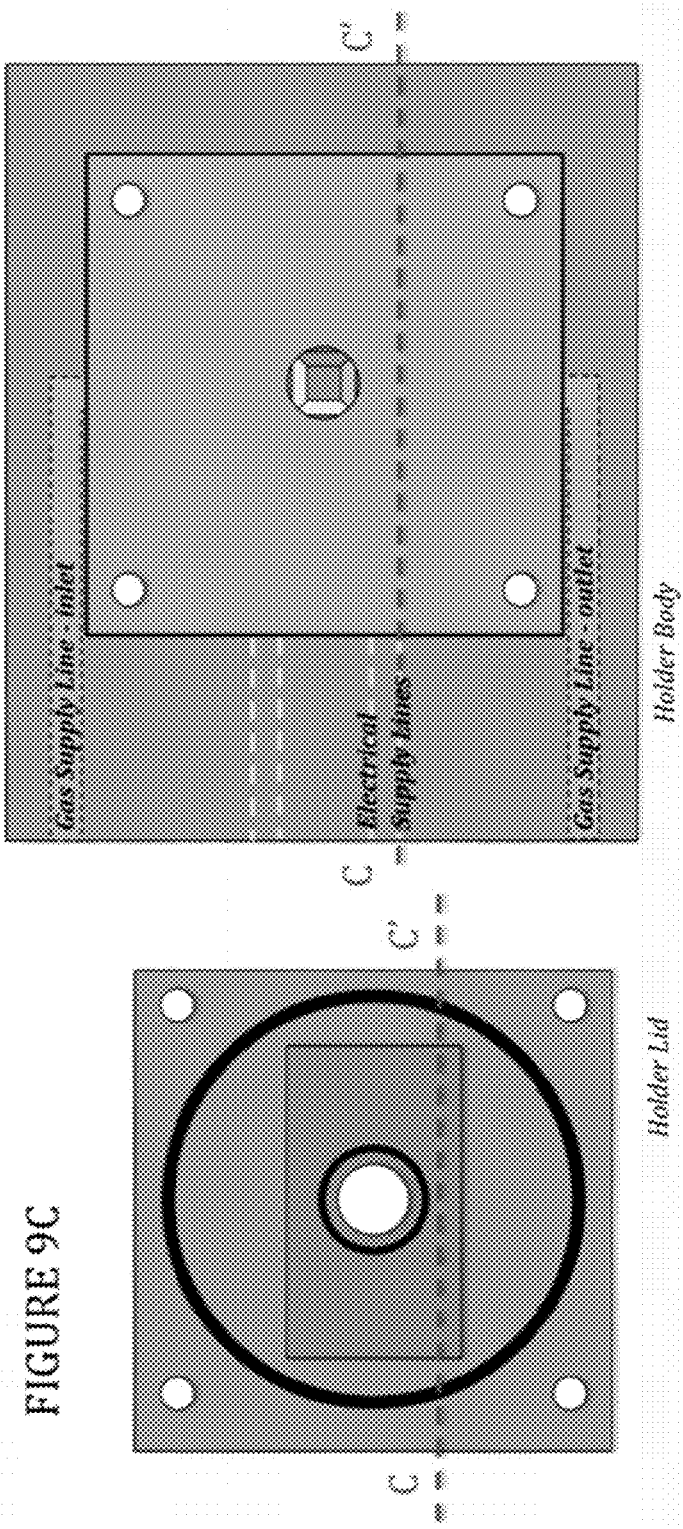
FIGURE 9C

ELECTRON MICROSCOPE SAMPLE HOLDER FOR FORMING A GAS OR LIQUID CELL WITH TWO SEMICONDUCTOR DEVICES

CROSS-REFERENCE TO RELATED APPLICATIONS

This application is filed under the provisions of 35 U.S.C. §121 and is a divisional of U.S. patent application Ser. No. 13/813,818, filed Jun. 13, 2013 in the name of John Damiano, Jr., et al., now U.S. Pat. No. 8,829,469 issued on Sep. 9, 2014, which was filed under the provisions of 35 U.S.C. §371 and claims the priority of International Patent Application No. PCT/US2011/46282 on Aug. 2, 2011, which claims priority to U.S. Provisional Patent Application No. 61/369,772, filed on Aug. 2, 2010, all of which are hereby incorporated by reference herein in their entireties.

FIELD

The invention relates generally to sample holders used for mounting samples in an electron microscope, e.g., a transmission electron microscope (TEM), a scanning transmission electron microscopy (STEM) and variations of the scanning electron microscopes (SEM) that use traditional TEM-type holders and stages, for imaging and analysis.

BACKGROUND

The sample holder is a component of an electron microscope providing the physical support for specimens under observation. Sample holders traditionally used for TEMs and STEMs, as well as some modern SEMs, consist of a rod that is comprised of three key regions: the end (300), the barrel (200) and the sample tip (100) (see, e.g., FIG. 1). In addition to supporting the specimen, the sample holder provides an interface between the inside of the instrument (i.e., a vacuum environment) and the outside world.

To use the sample holder, one or more samples are first placed on a support device. The support device is then mechanically fixed in place at the sample tip, and the sample holder is inserted into the electron microscope through a load-lock. During insertion, the sample holder is pushed into the electron microscope until it stops, which results in the sample tip of the sample holder being located in the column of the microscope. At this point, the barrel of the sample holder bridges the space between the inside of the microscope and the outside of the load lock, and the end of the sample holder is outside the microscope. To maintain an ultra-high vacuum environment inside the electron microscope, flexible o-rings are typically found along the barrel of the sample holder, and these o-rings seal against the microscope when the sample holder is inserted. The exact shape and size of the sample holder varies with the type and manufacturer of the electron microscope, but each holder contains these three key regions.

The sample holder can also be used to provide stimulus to the sample, and this stimulus can include temperature, electrical current, electrical voltage, mechanical strain, etc. One type of sample is a semiconductor device. The semiconductor device can be designed to have an array of electrical contact pads on it, and the sample holder can be designed to transfer electrical signals from an external source, through the holder, to the semiconductor device.

The need for high density arrays comes from an increasing demand to perform a wider variety of experiments on a sample within the microscope—a field known as in situ microscopy. As demonstrated in previous filings by the present inventors, semiconductor devices can be made to interact with a specimen positioned thereon by passing current or creating fields across or near a specimen. These electrical signals can be used to heat, cool, bias or charge a specimen, all while being viewed in real time within the microscope. Increasing the number of electrical contacts provided to a specimen increases the number of or type of experiments that can be done on the same device.

One type of sample holder is one in which (1) two semiconductor devices can be placed, (2) specimens can be placed on or near the semiconductor devices and (3) using the combination of holder and devices, the specimen's environment, including an electrical field and a gas or liquid flow, can be precisely controlled. Further, methods to introduce liquid or liquid mixtures to specimens within the microscope while containing and controlling the environment around specimens have been developed. However, there is a need for more advanced apparatuses and methods to contact and align devices used to form liquid or gas cells.

SUMMARY

The present invention relates generally to a novel liquid or gas sample holder which provides improved contact and alignment for microelectronic devices in the sample holder and as well as electrical contacts and multiple liquid or gas inputs/outputs to the specimens or microelectronic devices.

In one aspect, a sample holder for an electron microscope is described, said sample holder comprising a sample holder body and a sample holder lid, wherein the sample holder body comprises at least one pocket having a pocket bottom and pocket walls for the positioning of two microelectronic devices therein, and the sample lid has a top side and a bottom side.

In another aspect, a method of imaging a sample in a liquid and/or gaseous environment in an electron microscope is described, said method comprising inserting a sample in a sample holder, inserting the sample holder comprising the sample in an electron microscope, introducing a liquid and/or gas to the sample in the sample holder, and imaging the sample in the electron microscope, wherein the sample holder comprises a sample holder body and a sample holder lid, wherein the sample holder body comprises at least one pocket having a pocket bottom and pocket walls for the positioning of two microelectronic devices therein, and the sample lid has a top side and a bottom side.

Other aspects, features and embodiments of the invention will be more fully apparent from the ensuing disclosure and appended claims.

BRIEF DESCRIPTION OF FIGURES

FIG. 8A shows the loading of the generic window device of FIG. 2 in the holder body.

FIG. 8B shows the loading of the generic electrical device of FIG. 3 in the holder body.

FIG. 9A shows the loading of the generic window device of FIG. 2 with pads in the holder body, wherein the gas/liquid supply lines are not shown for clarity.

FIG. 9B shows the loading of the generic heating device of FIG. 4 in the holder body, wherein the gas/liquid supply lines are not shown for clarity.

FIG. 9C shows the positioning of the holder lid on the holder body comprising the window device and the heating device, wherein the gas/liquid supply lines are not shown for clarity.

DETAILED DESCRIPTION

Figure 1:
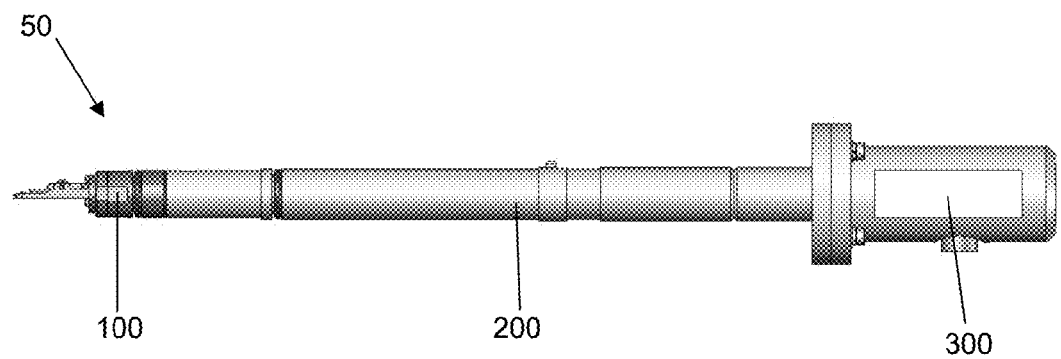
FIG. 1 shows a schematic of a generic specimen holder (50). The specimen holder is comprised of three regions: the tip (100), the barrel (200), and the end (300).

The present invention generally relates to novel samples holders, methods for introducing liquids or gases to the sample holder, and uses of the novel sample holder. It is to be understood that the specimen holder and specimen holder interface described herein are compatible with and may be interfaced with the semiconductor specimen support devices disclosed in International Patent Application Nos. PCT/US08/63200 filed on May 9, 2008, which is incorporated herein by reference in its entirety. It should be appreciated by one skilled in the art that alternative semiconductor sample support devices may be interfaced with the sample holder described herein. The sample holder provides mechanical support and a liquid or gaseous environment for one or more specimens and/or semiconductor support devices and may also provide electrical contacts to the specimens and/or semiconductor support devices. The sample holder can be manufactured with tips, barrels and ends of various shapes and sizes such that the specimen holder fits any manufacturer's electron microscope.

As defined herein, a "membrane region" on the semiconductor device corresponds to unsupported material comprised, consisting of, or consisting essentially of carbon, silicon nitride, SiC or other thin films generally 1 micron or less having a low tensile stress (<500 MPa), and providing an at least partially electron transparent region for supporting the at least one specimen. The membrane region may include holes or be hole-free. The membrane region may be comprised of a single material or a layer of more than one material and may be either uniformly flat or contain regions with varying thicknesses.

As defined herein, "microelectronic" means a semiconductor material, such as silicon, that is intermediate in electrical conductivity between conductors and insulators.

As defined herein, "device" means a structure used to either contain liquids or gases around a specimen and includes, but is not limited to, a window device, an electrical device and a heating device.

As defined herein, a "cell" corresponds to a region defined by two substantially parallel positioned devices, wherein at least one liquid and/or gas can be flowed therethrough. A specimen can be positioned within the cell for imaging purposes.

As defined herein, "specimen" means the object being studied in the electron microscope, typically placed within or on the device in the region of liquid or gas control which is at least partially electron transparent (e.g., nanoparticle, catalyst, thin section, etc.).

As defined herein, a "pocket" corresponds to a space in the sample cell holder that defines the vertical walls of the cell, into which the two substantially parallel devices are positioned to form the cell.

As defined herein, "contact points" correspond to protrusions from the walls of the pocket that are engineered to align the devices when positioned in the pocket.

As defined herein, "window device" means a device used to create a physical, electron transparent barrier on one boundary and the vacuum environment of the electron microscope on the other and is generally a silicon nitride-based semiconductor micro-machined part, although other semiconductor materials are contemplated.

As defined herein, "frame" means a rigid region around the perimeter of a device that is used to provide mechanical support to the entire device structure. Preferred embodiments include a silicon frame, even more preferably a silicon frame selectively etched using KOH, a silicon frame selectively etched using reactive ion etching (RIE), a silicon frame selectively etched using deep reactive ion etching (DRIE), or a silicon frame released from an silicon-on-insulator (SOI) wafer.

The present application improves on the prior art by providing a simple apparatus and method for aligning and exchanging devices and making electrical contacts to said devices.

Figure 2:
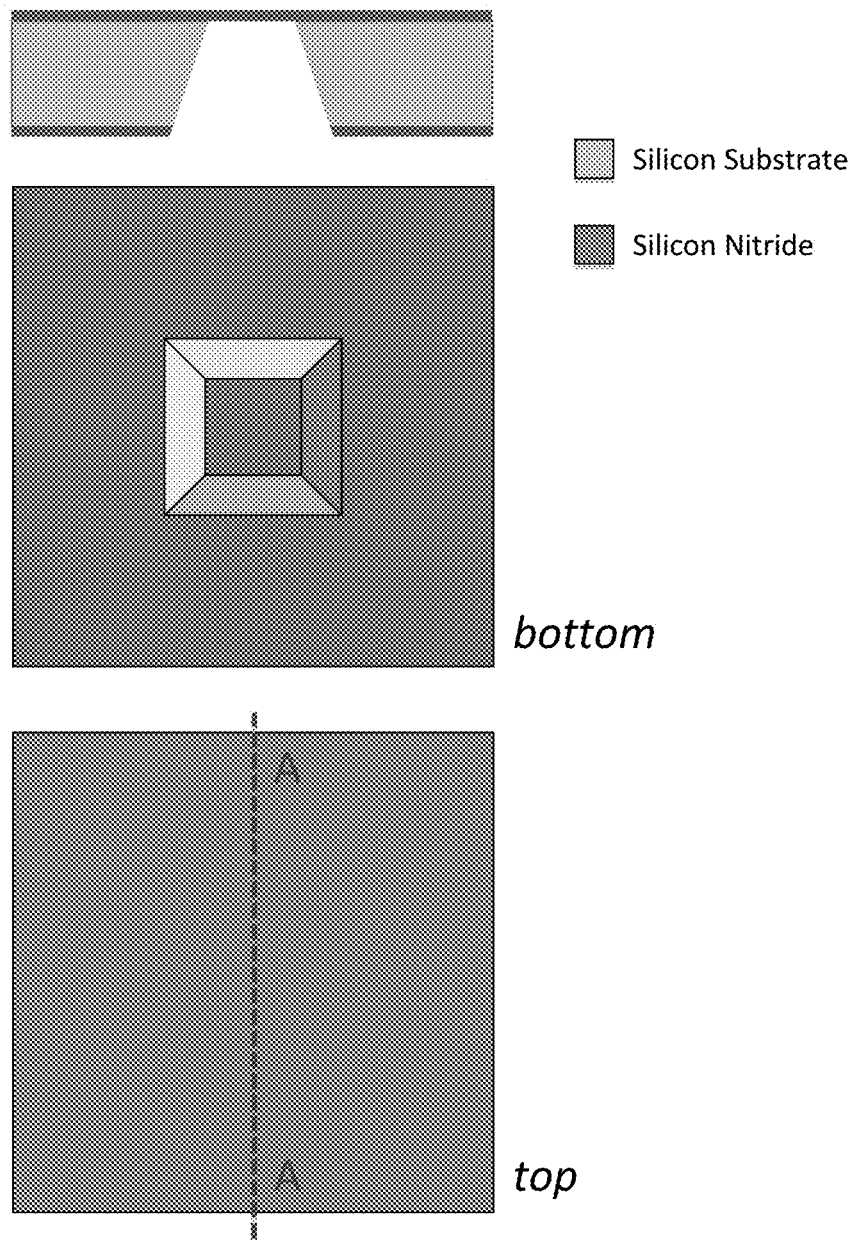
FIG. 2 shows a schematic of a generic window device having a top, bottom and cross-section at A-A'.

A schematic of a generic window device is shown in FIG. 2. A thin membrane region, e.g., amorphous silicon nitride, forms the window whereby imaging and analysis can be performed through the window. The window must withstand a differential pressure between the gas cell and the vacuum environment of the microscope. The window's "frame" is preferably single-crystal silicon. The frame is formed by selectively etching a cavity in the single-crystal silicon substrate. A thin "spacer" layer can be formed around the membrane window (for example as shown in the window device in FIG. 6). The thickness of this layer can be precisely set, and, when a second device, e.g., a heating device or another window device, is stacked atop the window device, the thickness of the spacer sets the distance between the devices and hence the thickness of the gas or liquid layer between the devices. Preferred spacer thickness is in a range from about 0.1 μm to about 50 μm.

Spacer materials contemplated herein include, but are not limited to, epoxy-based photoresists such as SU-8 (Microchem, Newton, Mass.), grown or deposited semiconductor layers, deposited or electroplated metal films and polyimide films such as the HD-4100 series of polymers (Hitachi Dupont MicroSystems LLC).

Figure 3:
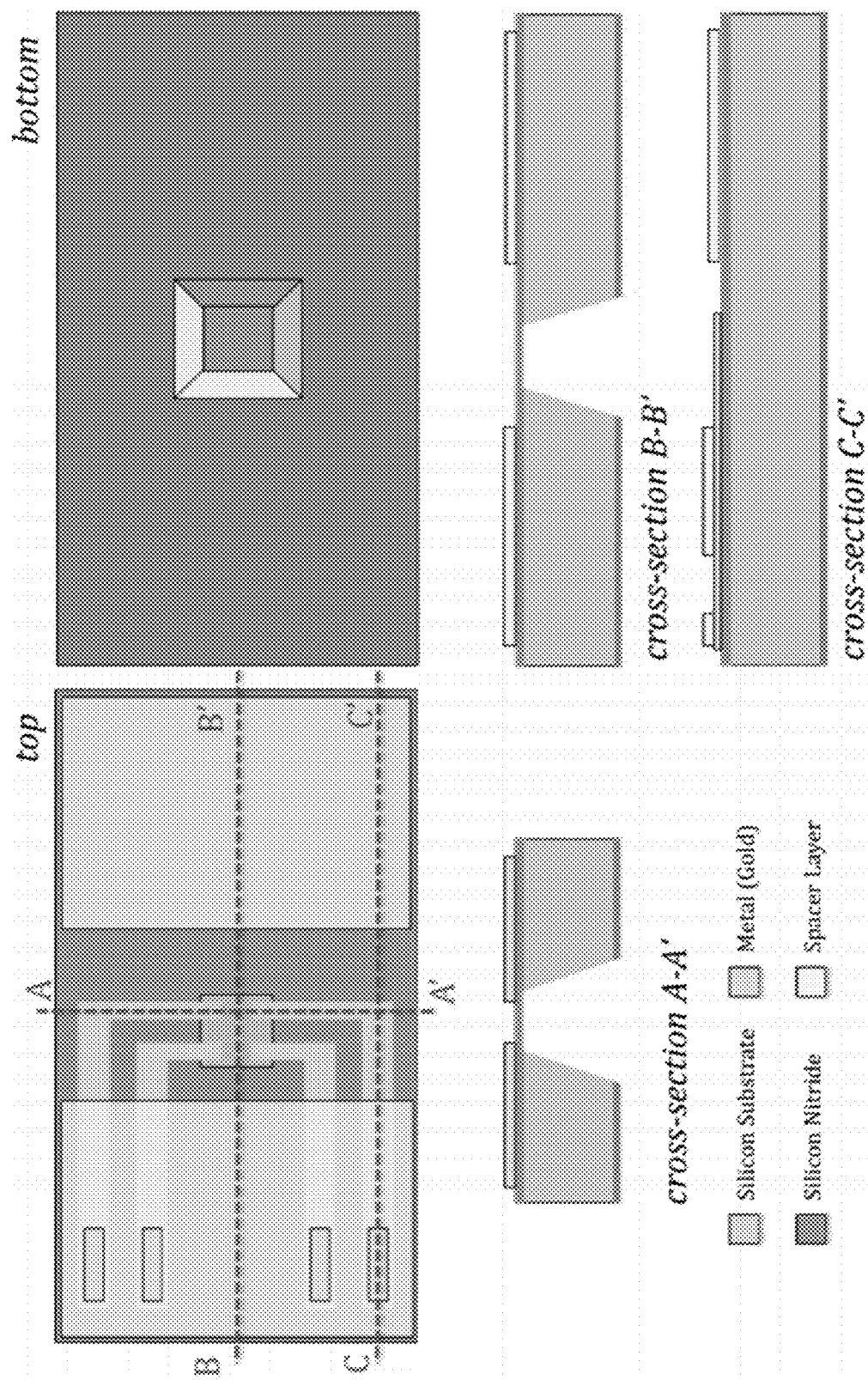
FIG. 3 shows a schematic of a generic electrical device having a top, bottom, cross-section at A-A', cross-section at B-B', and cross-section at C-C'.

A schematic of a generic electrical biasing device is shown in FIG. 3. The electrical biasing device has electrodes that run from the edge of the device to the center of a thin silicon nitride membrane. Specimens can be placed on the silicon nitride membrane region for inspection. Typically voltage or current is applied to the electrodes at the edge of the chip, and these signals travel to the membrane region and the specimen. The "frame" portion of the device, surrounding the membrane, can be single-crystal silicon. The frame is formed by selectively etching a cavity in the single-crystal silicon substrate. Gold contact pads are used to form the electrodes. The silicon nitride material is electrically insulating. A thin "spacer" layer can be formed around the membrane window. The thickness of this layer can be precisely set, and, when a second device, e.g., a window device, is stacked atop the electrical device, the thickness of the spacer sets the distance between the devices and hence the thickness of the liquid layer between the devices. Preferred spacer thickness is in a range from about 0.1 μm to about 50 μm. For example, the spacer layer can be removed over the gold electrodes at the edge of the electrical device where contacts are formed. The cut in the spacer layer forms a seal around the contact when the devices are stacked and prevents the liquid from reaching the contact point between the device and the sample holder. It should be appreciated that the electrical biasing device can be larger, smaller, or the same dimensions as the window device.

Figure 4:
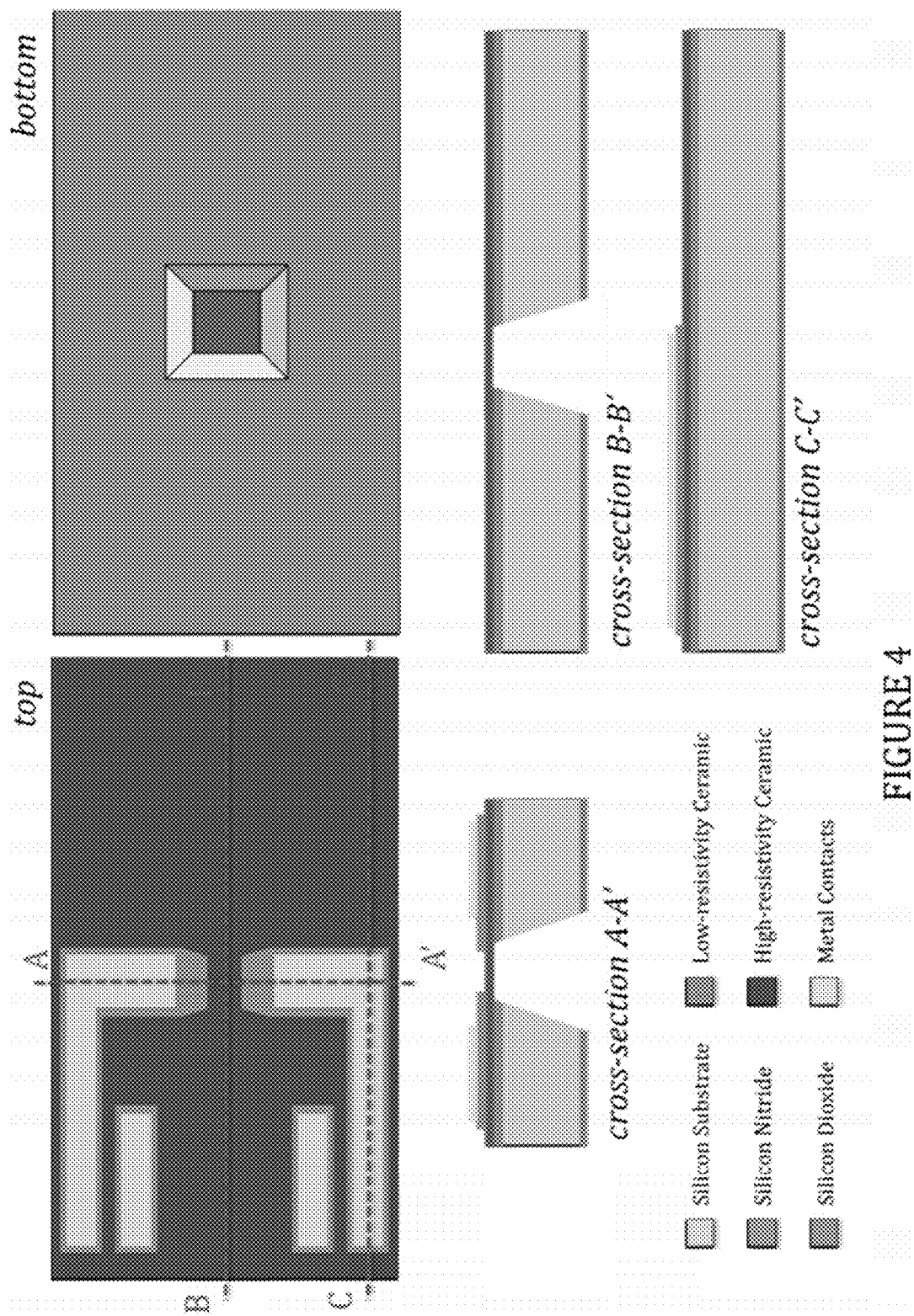
FIG. 4 shows a schematic of a generic heating device having a top, bottom, cross-section at A-A', cross-section at B-B', and cross-section at C-C'.

A schematic of a generic heating device is shown in FIG. 4. Specimens can be placed on the thin membrane region, which is formed from layers of a conductive ceramic material, e.g., silicon carbide. When electrical current is forced through the ceramic membrane, the membrane region heats, heating the specimen. The "frame" portion of the device, surrounding the membrane, can be single-crystal silicon. The frame is formed by selectively etching a cavity in the single-crystal silicon substrate. Gold contact pads are used to form electrical contacts to the ceramic material. An electrically insulating layer of silicon dioxide or equivalent thereof between the ceramic layers and the silicon substrate prevents current flow from the ceramic membrane to the substrate, so all current stays in the membrane. In the embodiment shown in FIG. 4, the gold contact pads extend to one side of the device. It should be appreciated that the heating device can be larger, smaller, or the same dimensions as the window device.

An electrochemical cell holder comprises a window device and an electrical device. A thermal cell holder comprises a window device and a heating device. The liquid cell holder uses two window devices. At least one device includes a spacer layer. When one device is placed atop the other, with the nitride membranes facing each other, the gap between the devices is set by the thickness of the spacer layer(s). Controlling the thickness of this spacer layer is critical: if the spacer is too thin, the specimens will get crushed. If the spacer is too thick, then there can be extra liquid around the specimen, which degrades the resolution of the image. The thickness of the spacer layer(s) is readily determined by the skilled artisan.

Figure 5:
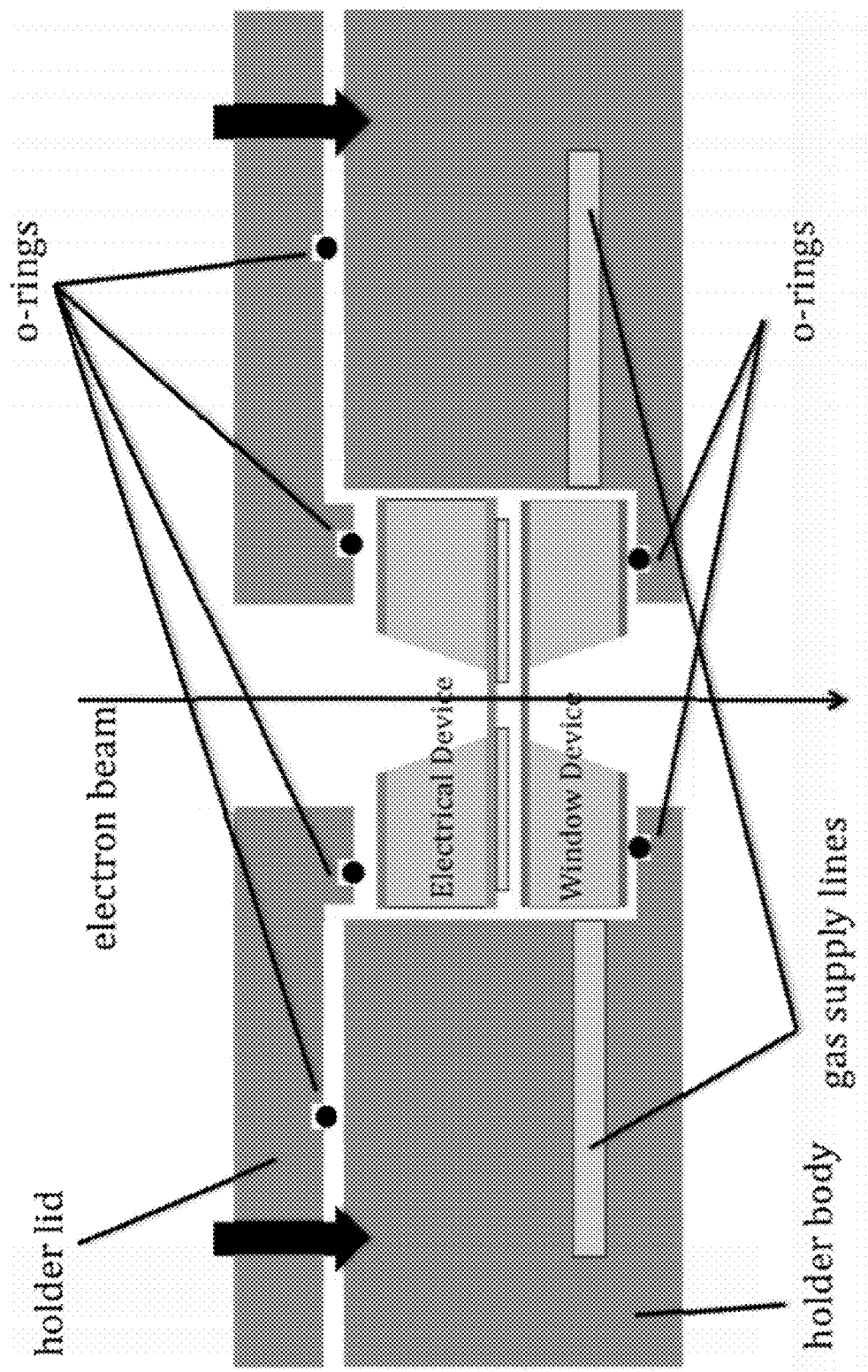
FIG. 5 shows a cross-section of a sample holder at A-A' described herein for an electrochemical cell wherein the gas/liquid supply lines are not shown for clarity.

FIG. 5 shows a cross-sectional schematic of the complete electrochemical cell with electrical biasing and window devices included. Liquid supply lines are not shown for clarity. The electrochemical cell is comprised of an electrochemical cell holder body, an electrochemical cell holder lid, one window device, one electrical biasing device, and o-rings used to seal the cell. The devices are stacked such that the membrane portion of each device is aligned. Additionally, the pair of stacked membranes is also aligned with holes in the holder body and holder lid such that an electron beam can pass through the entire assembly.

FIGS. 7 and 8A-8C show cross-sectional and plan view schematics of the electrochemical cell holder and demonstrate how devices are loaded into the sample holder, how electrical contacts are formed, and how the environment inside the electrochemical cell is maintained.

Figure 7:
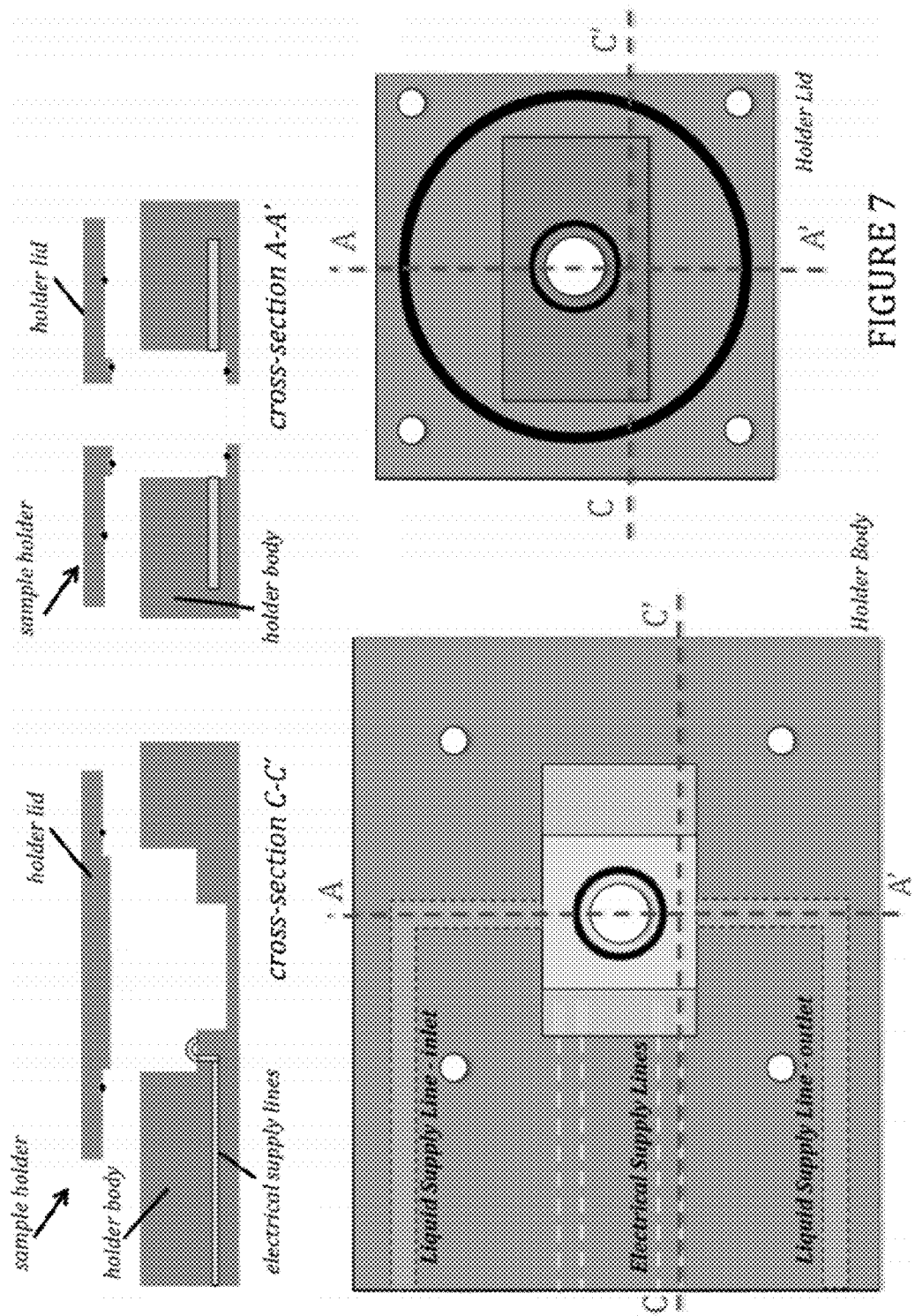
FIG. 7 shows the top side of the holder body, the bottom side of the holder lid, and a cross-section of the lid and body when stacked together at A-A' and C-C'.

FIG. 7 shows the empty holder body and holder lid structures with a cross-sectional view of both. The holder body can have a cavity with a deep pocket and a shallow pocket when the size of the electrical or thermal device is different from that of the window device (e.g., in FIG. 7, the window device is smaller in length than the electrical or thermal device although it is contemplated herein that the electrical or thermal device may be smaller in length than the window device). It should be appreciated that when the window device and the electrical or thermal device have the same length and width that the holder body can have one deep cavity for accommodating both devices. The deep pocket has a bottom with a electron beam hole roughly centered in the pocket, and at least one o-ring or other sealing means can be placed around the hole. The depth of the pocket relative to the shallow pocket plane is approximately the thickness of the window device. The length and width of the deep pocket is slightly larger than a window device, as will be discussed at length hereinbelow. The length and width of the shallow pocket is slightly larger than the electrical or thermal device, as will be discussed hereinbelow. The shallow pocket fully encloses the deep pocket. On one side of the shallow pocket, away from the deep pocket, a row of contact points can be positioned that are used to electrically contact the electrical or thermal device when this device is loaded into the holder body. The depth of the shallow pocket is approximately the thickness of the electrical or thermal device. The holder lid can have a thick region and a thin region for alignment convenience. The length and width of the thick region is approximately the size of the shallow pocket in the holder body, such that the thick region can be inserted into the shallow pocket. An electron beam hole is placed in roughly the center of the thick region, and an o-ring or other sealing means surrounds the hole. The thin region extends beyond the thick region, and has more than one hole that allows the user to fasten the holder lid to the holder body with screws or other fastening means. A second o-ring or other sealing means surrounds the thick region and is used to form a seal between the holder lid and holder body. Gases or liquids are supplied to the pockets through supply lines in the holder body that extend from the pocket(s) to the outside of the opposite end of the holder.

FIG. 8A shows the window device loaded into the holder body along the A-A' cross-section for illustrative purposes. The device is placed in the deep pocket with the spacer layer (when present) facing up and the etched cavity in the substrate facing down. The bottom of the device sits on the o-ring or other sealing means surrounding the hole in the deep pocket, and a continuous seal is formed around the hole when pressure is applied and the o-ring is compressed between the holder body and the device. The top of the window device is at roughly the same height as the bottom plane of the shallow pocket.

FIG. 8B shows the electrical biasing device loaded into the holder body for illustrative purposes. The device is placed in the shallow pocket with the spacer layer and/or thin membrane region facing down (i.e., facing the thin membrane region of the underlying window device) and the etched cavity in its substrate facing up. The spacer layer features on the electrical biasing device sit atop the window device. The gold contact pads on the electrical biasing device are aligned with the underlying contact points in the shallow pocket. Since the deep pocket and shallow pocket can have two common sides, as indicated in FIG. 7, the devices in the pockets are aligned to a common surface and are therefore aligned to each other. This critical "self-alignment" feature allows the devices to be aligned with respect to each other with great precision.

Figure 8C:
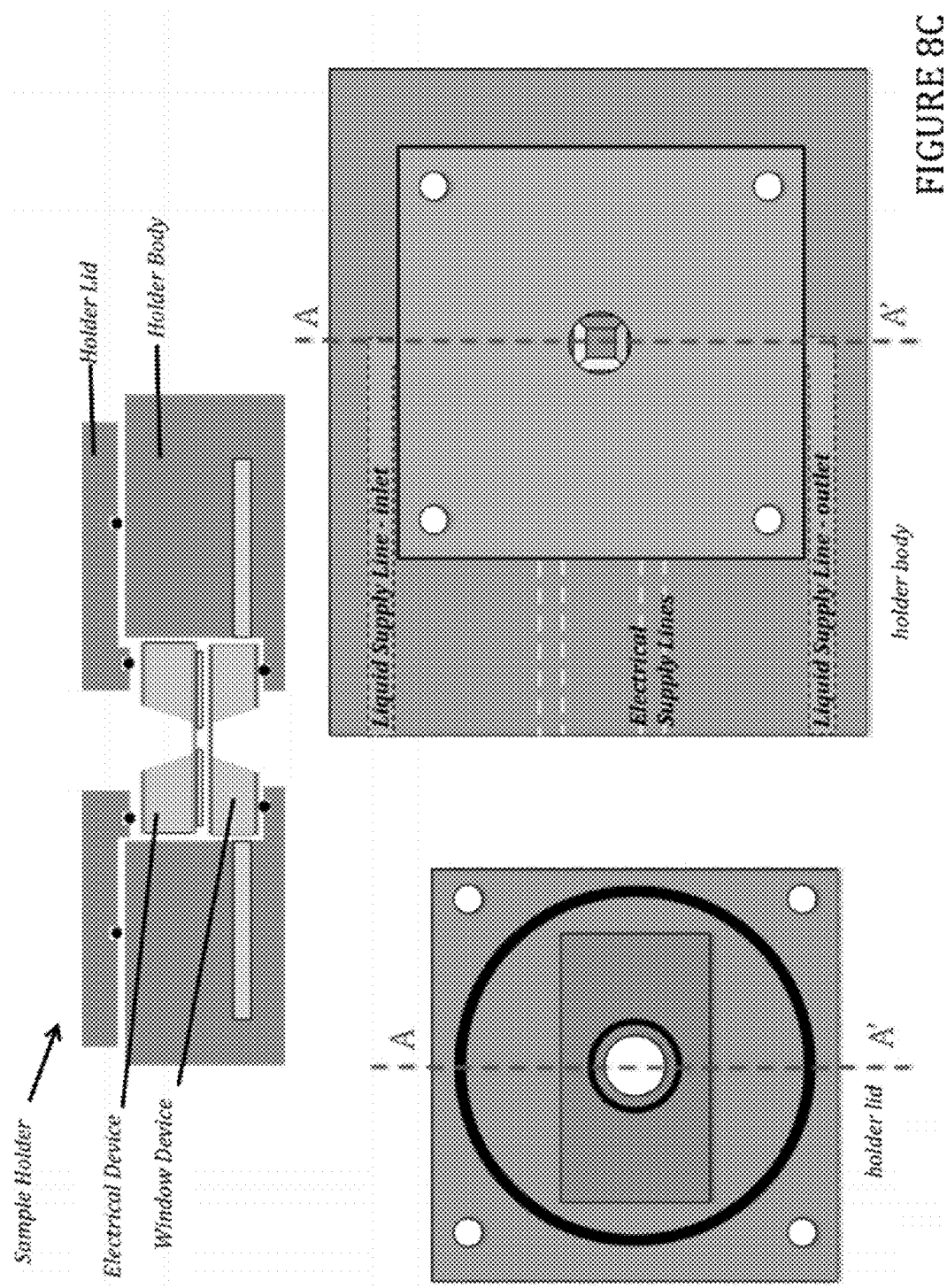
FIG. 8C shows the positioning of the holder lid on the holder body comprising the window device and the electrical device.

FIG. 8C shows the final assembly of the electrochemical cell holder for illustrative purposes. The holder lid is placed atop the holder body and affixed to the holder body using more than one screw or other fastening means. The thicker portion of the lid fits atop the device stack. The o-ring or other sealing means in the thicker portion, which is positioned in proximity to the hole in the lid, fits around the cavity of the electrical device and forms a seal between the electrical device and the lid. The thickness of this thicker portion determines the amount of compression on the o-rings or other sealing means that surround the holes in the holder body and the holder lid. Adequate compression is required to form a tight seal around these holes and prevent gases or liquids from escaping around the devices. Attaching the holder lid pushes down on the device stack, compressing these o-rings or other sealing means and forming a seal. Adequate compression will also force the gold contact pads on the electrical device on to the underlying contact points, forming an electrical contact. The distance between the devices is set by the thickness of the spacer layer and this distance does not change when the devices are pushed together when sealing the cell. The second o-ring or sealing means on the holder lid, in the thinner portion of the lid, forms a seal between the holder body and the holder lid. This o-ring is compressed when the lid is attached to the body and prevents gases or liquids from escaping from between the holder body and the holder lid.

Figure 6:
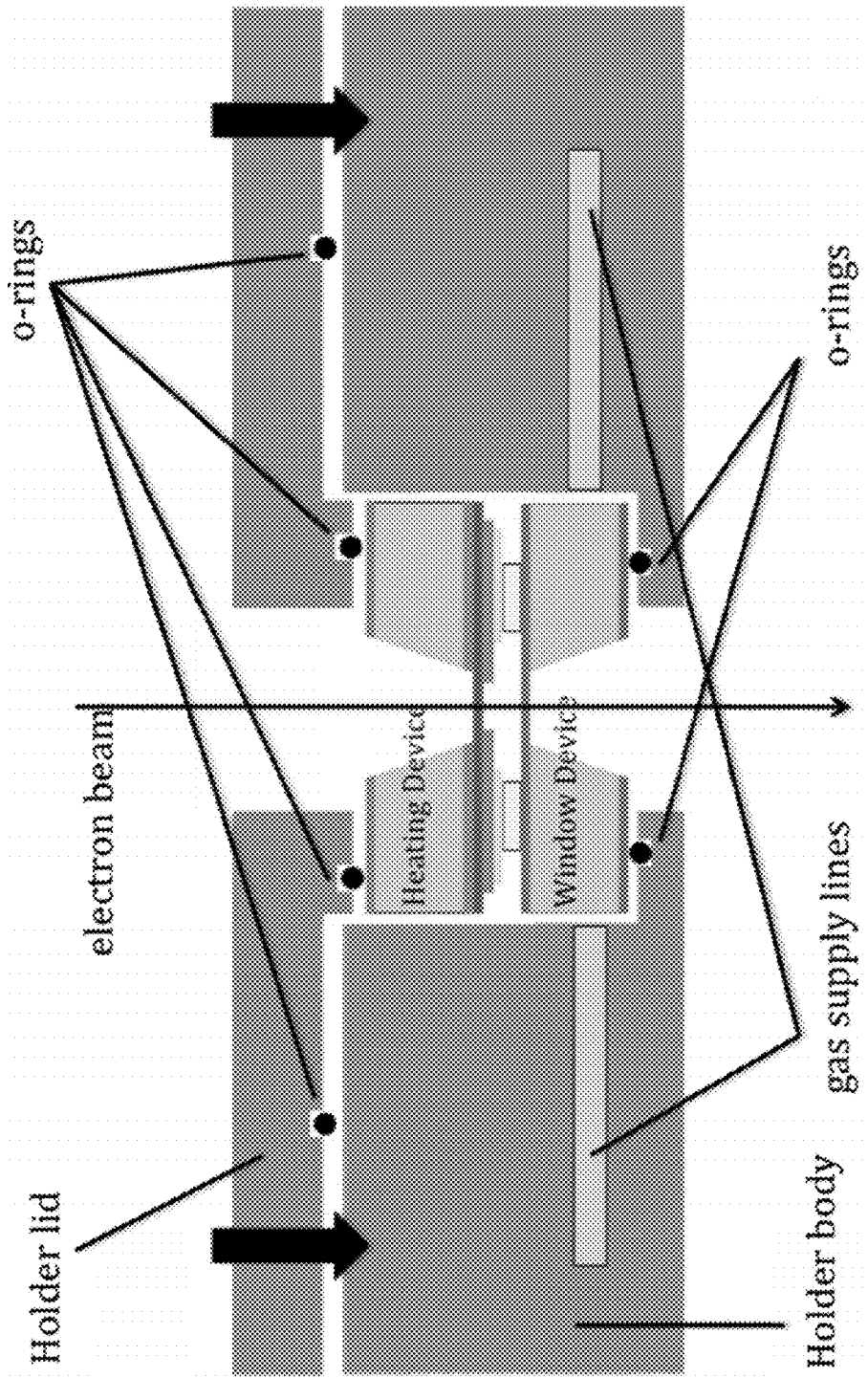
FIG. 6 shows a cross-section of a sample holder at A-A' described herein for a thermal cell wherein the gas/liquid supply lines are not shown for clarity.

FIG. 6 shows a cross-sectional schematic of the complete thermal cell with heating and window devices included. Gas or liquid supply lines are not shown for clarity. The thermal cell is comprised of a gas cell holder body, a gas cell holder lid, one window device, one heating device, and o-rings used to seal the cell. The devices are stacked such that the membrane portion of each device is aligned. Additionally, the pair of stacked membranes is also aligned with holes in the holder body and holder lid such that an electron beam can pass through the entire assembly.

FIGS. 7 and 9A-9C show cross-sectional and plan view schematics of the thermal cell holder and demonstrate how devices are loaded into the sample holder, how electrical contacts are formed, and how the environment inside the thermal cell is maintained.

FIG. 9A shows the window device loaded into the holder body along the C-C' cross-section for illustrative purposes. The device is placed in the deep pocket with the spacer layer facing up and the etched cavity in the substrate facing down. The bottom of the device sits on the o-ring or other sealing means surrounding the hole in the deep pocket, and a continuous seal is formed around the hole when pressure is applied and the o-ring is compressed between the holder body and the device. The top of the window device is at roughly the same height as the bottom plane of the shallow pocket.

FIG. 9B shows the thermal device loaded into the holder body for illustrative purposes. The device is placed in the shallow pocket with the spacer layer and/or thin membrane region facing down (i.e., facing the thin membrane region of the underlying window device) and the etched cavity in its substrate facing up. The thermal device sits atop the spacer layer features on the window device. The gold contact pads on the thermal device are aligned with the underlying contact points in the shallow pocket. Since the deep pocket and shallow pocket can have two common sides, as indicated in FIG. 7, the devices in the pockets are aligned to a common surface and are therefore aligned to each other. This critical "self-alignment" feature allows the devices to be aligned with respect to each other with great precision.

FIG. 9C shows the final assembly of the thermal cell holder for illustrative purposes. The holder lid is placed atop the holder body and affixed to the holder body using more than one screw or other fastening means. The thicker portion of the lid fits atop the device stack. The o-ring or other sealing means in the thicker portion, which is positioned in proximity to the hole in the lid, fits around the cavity of the heating device and forms a seal between the heating device and the lid. The thickness of this thicker portion determines the amount of compression on the o-rings or other sealing means that surround the holes in the holder body and the holder lid. Adequate compression is required to form a tight seal around these holes and prevent gases or liquids from escaping around the devices. Attaching the holder lid pushes down on the device stack, compressing these o-rings or other sealing means and forming a seal. Adequate compression will also force the gold contact pads on the thermal device on to the underlying contact points, forming an electrical contact. The distance between the devices is set by the thickness of the spacer layer and this distance does not change when the devices are pushed together when sealing the cell. The second o-ring or sealing means on the holder lid, in the thinner portion of the lid, forms a seal between the holder body and the holder lid. This o-ring is compressed when the lid is attached to the body and prevents gases or liquids from escaping from between the holder body and the holder lid.

Figure 15:
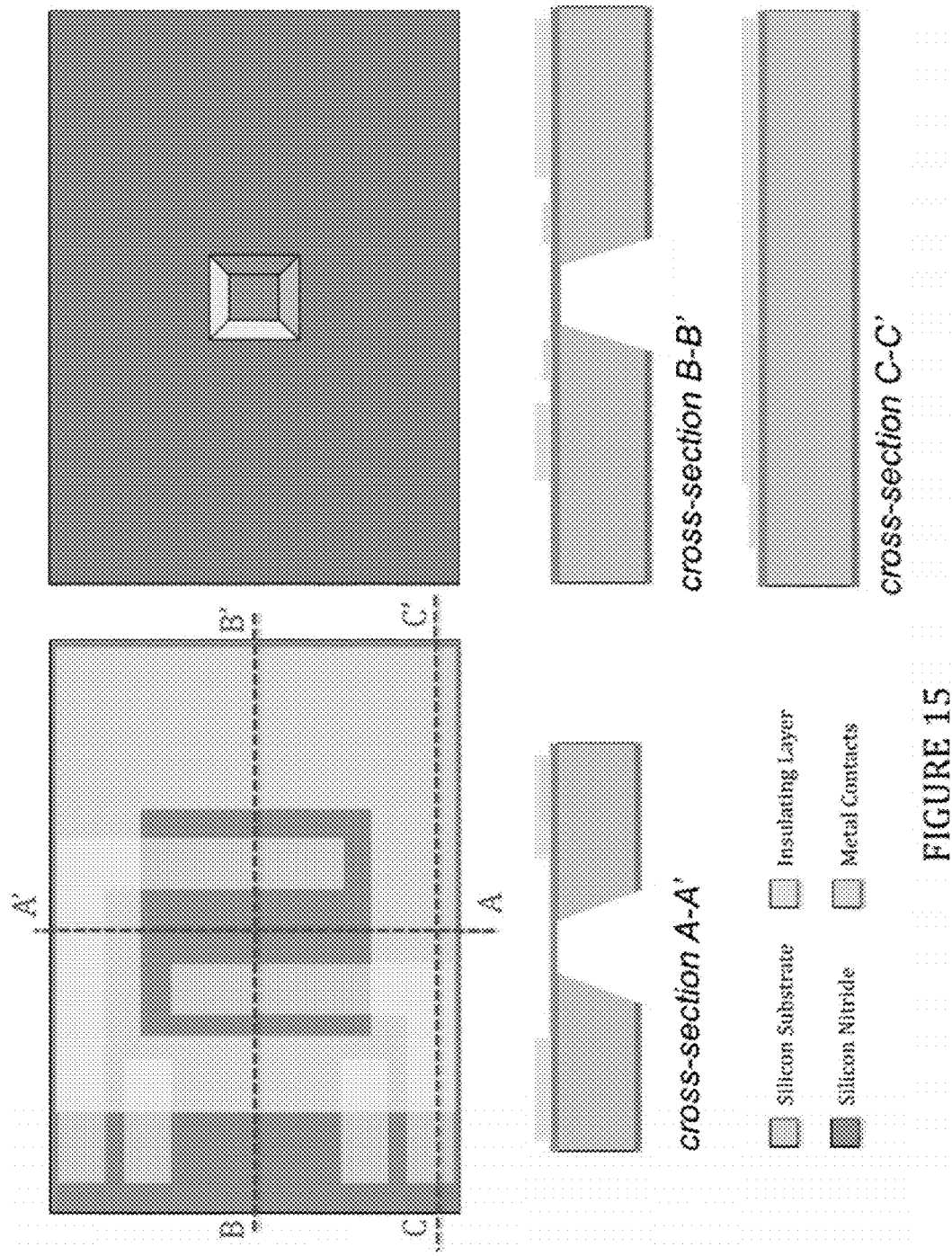
FIG. 15 shows a schematic of an alternate generic window device with gold electrodes having a top, bottom, cross-section at A-A', cross-section at B-B', and cross-section at C-C'.

Another embodiment of the gas or electrochemical cell is shown in FIGS. 15-18. In this embodiment, a schematic of an alternate generic window device with gold electrodes is shown in FIG. 15. Typically voltage or current is applied to the electrodes at the edge of the chip, and these signals travel to contact areas near the edge of the thin membrane region. The thin membrane region, e.g., amorphous silicon nitride, forms the window whereby imaging and analysis can be performed through the window. The window must withstand a differential pressure between the gas cell and the vacuum environment of the microscope. The window's "frame" is single-crystal silicon. The frame is formed by selectively etching a cavity in the single-crystal silicon substrate. Gold contact pads are used to form the electrodes. A thin insulating layer is formed around the membrane window. This layer prevents shorting between the device and the holder body when the device is placed into the holder body.

Insulating materials contemplated herein include, but are not limited to, epoxy-based photoresists such as SU-8 (Microchem, Newton, Mass.), grown or deposited semiconductor layers and polyimide films such as the HD-4100 series of polymers (Hitachi Dupont Micro Systems LLC).

Figure 16:
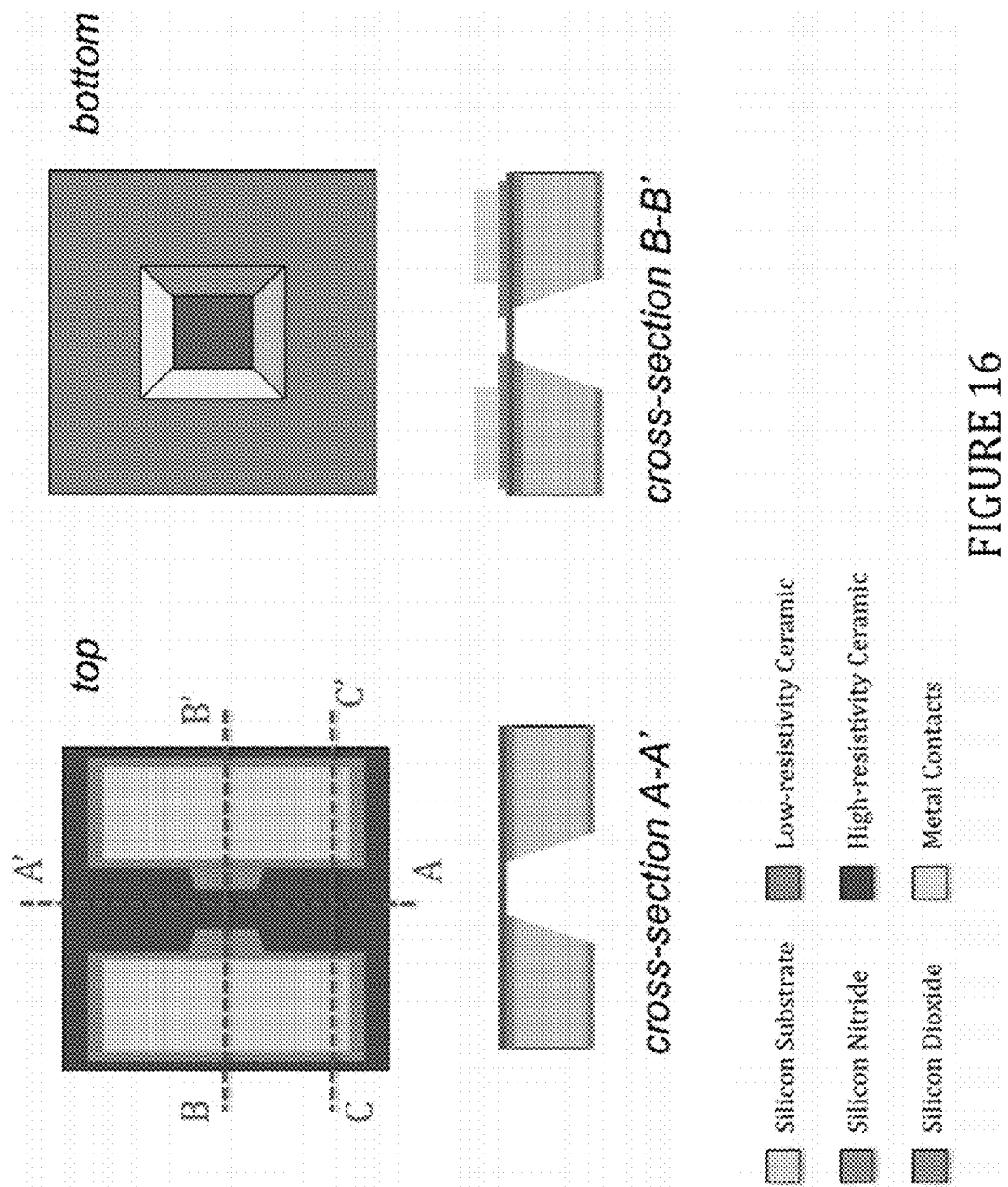
FIG. 16 shows a schematic of an alternate generic heating device having a top, bottom, cross-section at A-A', cross-section at B-B', and cross-section at C-C'.

A schematic of an alternate generic heating device is shown in FIG. 16. Specimens can be placed on the thin membrane region, which is formed from layers of a conductive ceramic material, e.g., silicon carbide. When electrical current is forced through the ceramic membrane, the membrane region heats, heating the specimen. The "frame" portion of the device, surrounding the membrane, can be single-crystal silicon. The frame is formed by selectively etching a cavity in the single-crystal silicon substrate. Gold contact pads are used to form electrical contacts to the ceramic material. An electrically insulating layer of silicon dioxide or equivalent thereof between the ceramic layers and the silicon substrate prevents current flow from the ceramic membrane to the substrate, so all current stays in the membrane. In the embodiment shown in FIG. 16, the thickness of the gold contact pads can be precisely set, and, when a second device, e.g., a window device, is stacked atop the heating device, the thickness of the heating device gold contact pads sets the distance between the devices and hence the thickness of the gas or liquid layer between the devices. Preferred spacer thickness is in a range from about 0.1 µm to about 50 µm.

Figure 17:
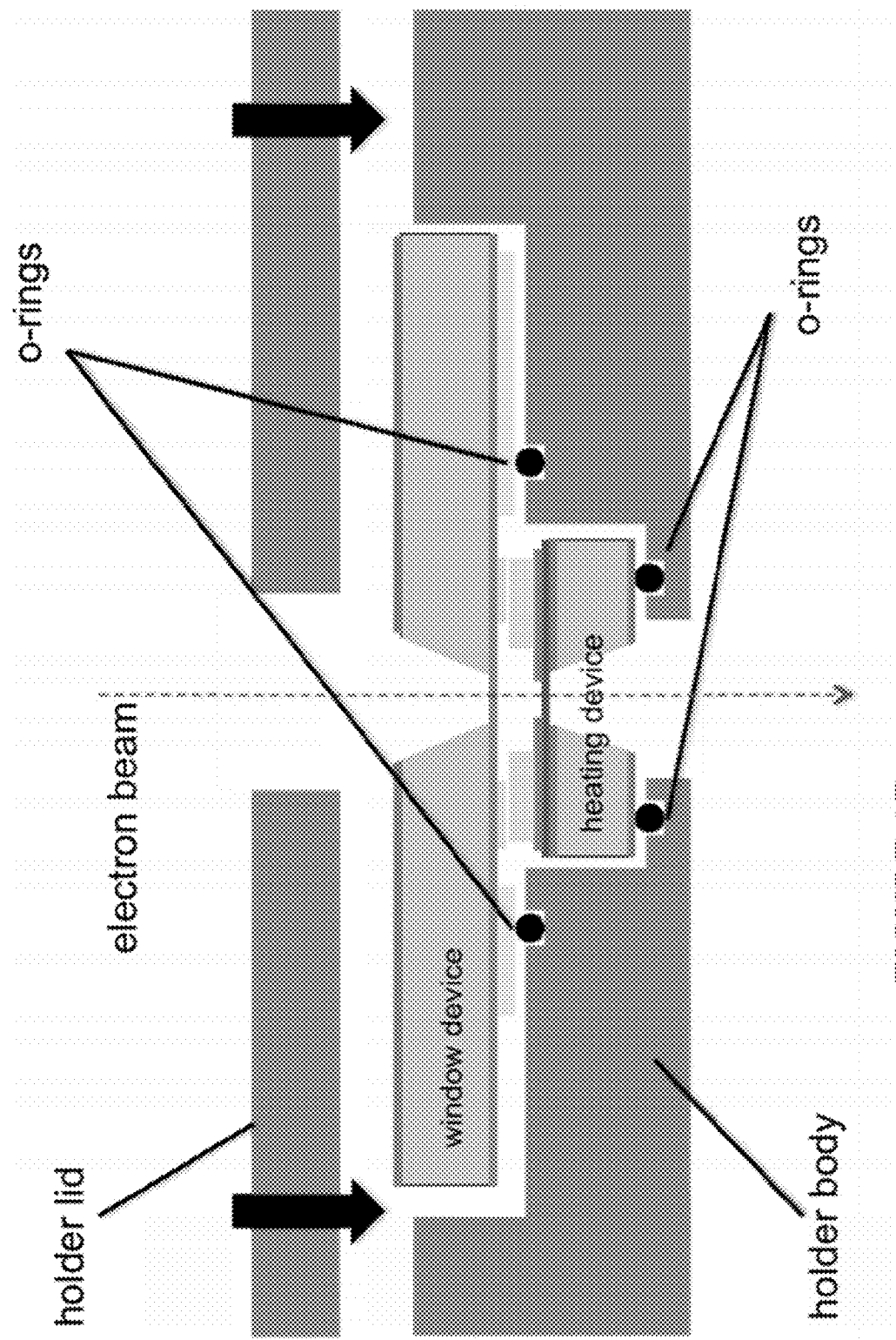
FIG. 17 shows a cross-section of a sample holder at B-B' described herein for an electrochemical cell wherein the gas/liquid supply lines are not shown for clarity.

FIG. 17 shows a cross-sectional schematic of the complete alternate gas or electrochemical cell with heating and window devices included. Gas or liquid supply lines are not shown for clarity. The cell is comprised of a holder body, a holder lid, one window device, one heating device, and o-rings used to seal the cell. The devices are stacked such that the membrane portion of each device is aligned. Additionally, the pair of stacked membranes is also aligned with holes in the holder body and holder lid such that an electron beam can pass through the entire assembly.

Figure 18:
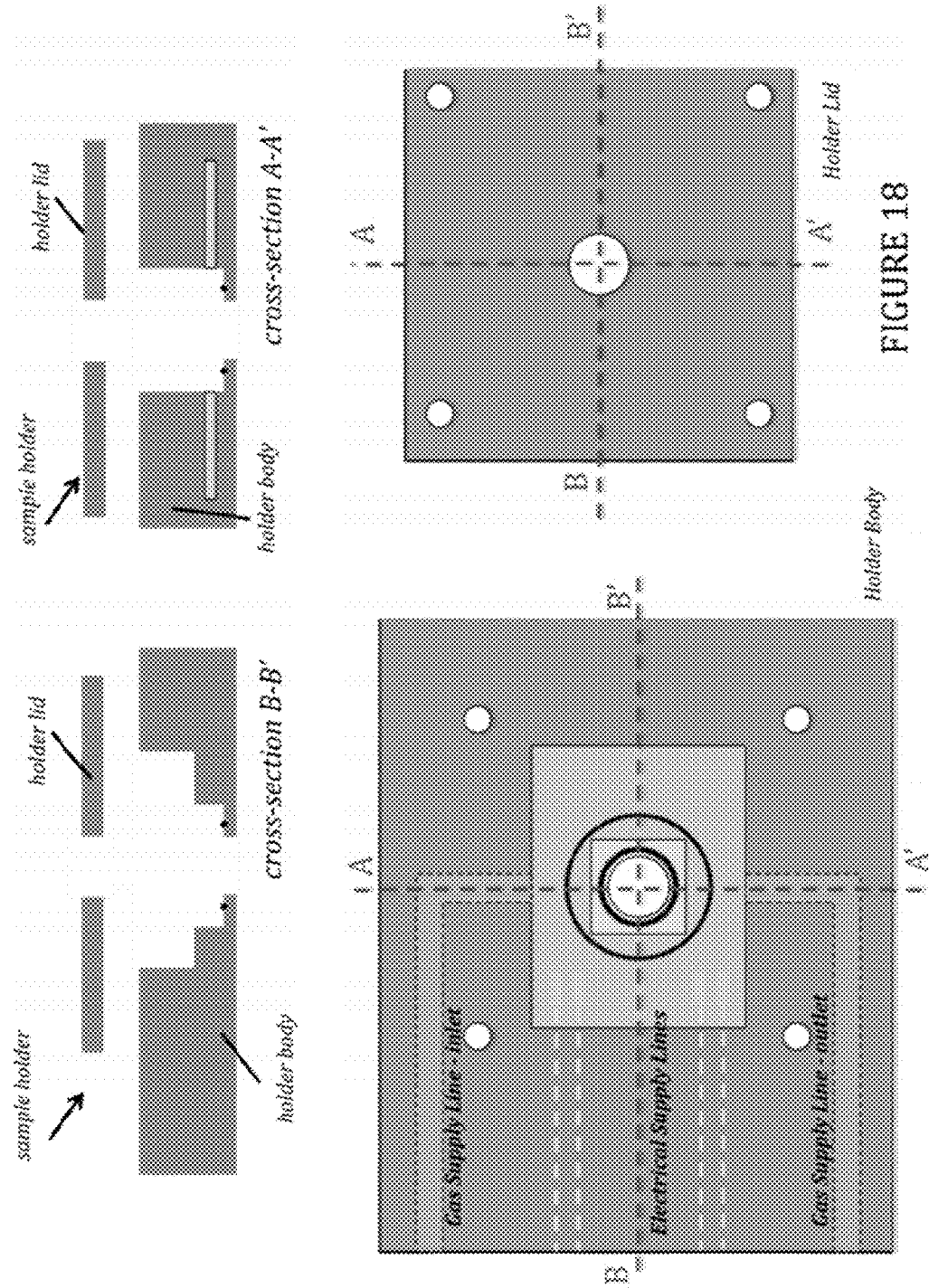
FIG. 18 shows the top side of the holder body, the bottom side of the holder lid, and a cross-section of the lid and body when stacked together at A-A' and B-B'.

FIG. 18 shows cross-sectional and plan view schematics of the alternate gas or electrochemical cell holder body and holder lid without devices inserted.

Figure 19A:
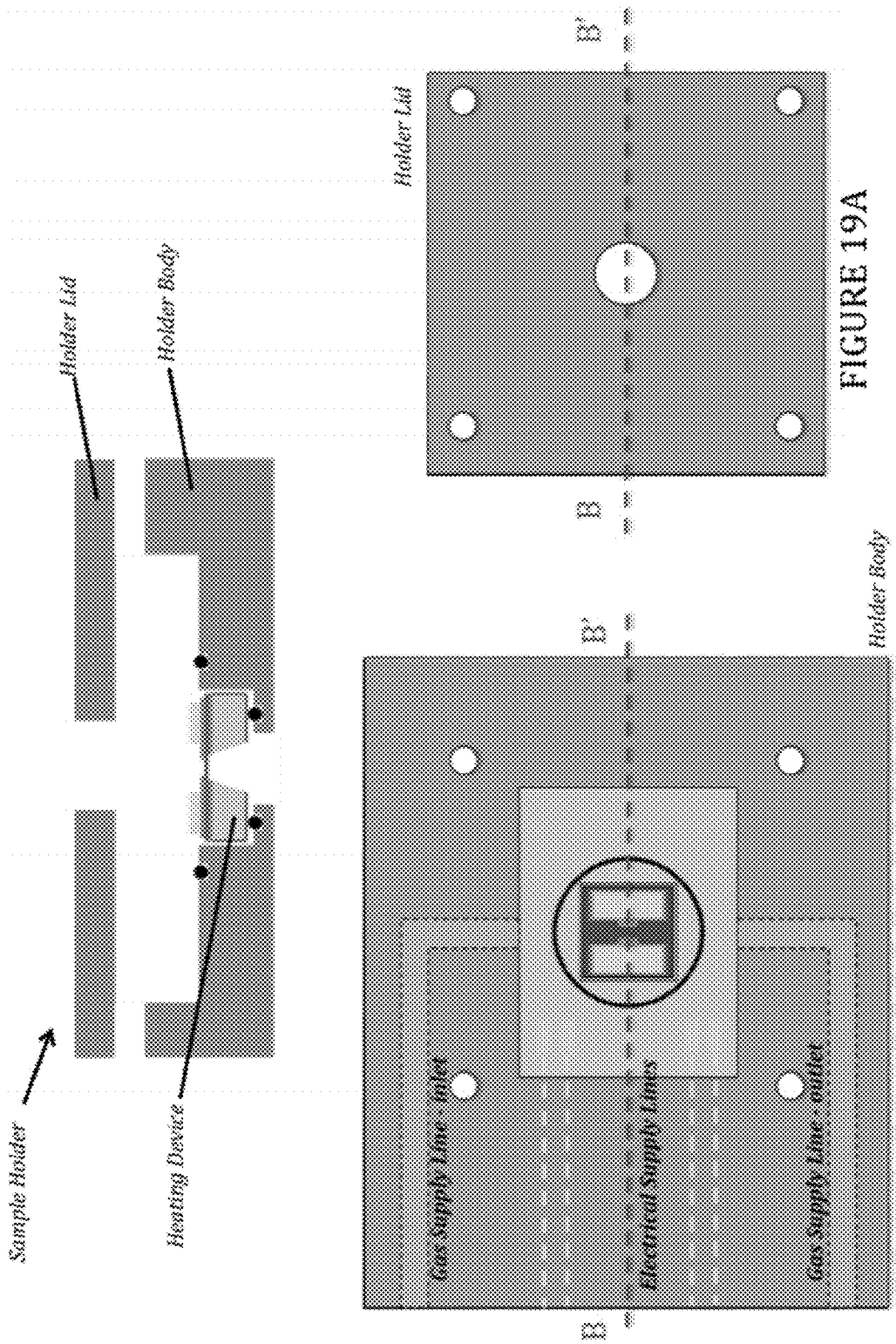
FIG. 19A shows the loading of the alternate generic heating device of FIG. 16 in the holder body.
Figure 19B:
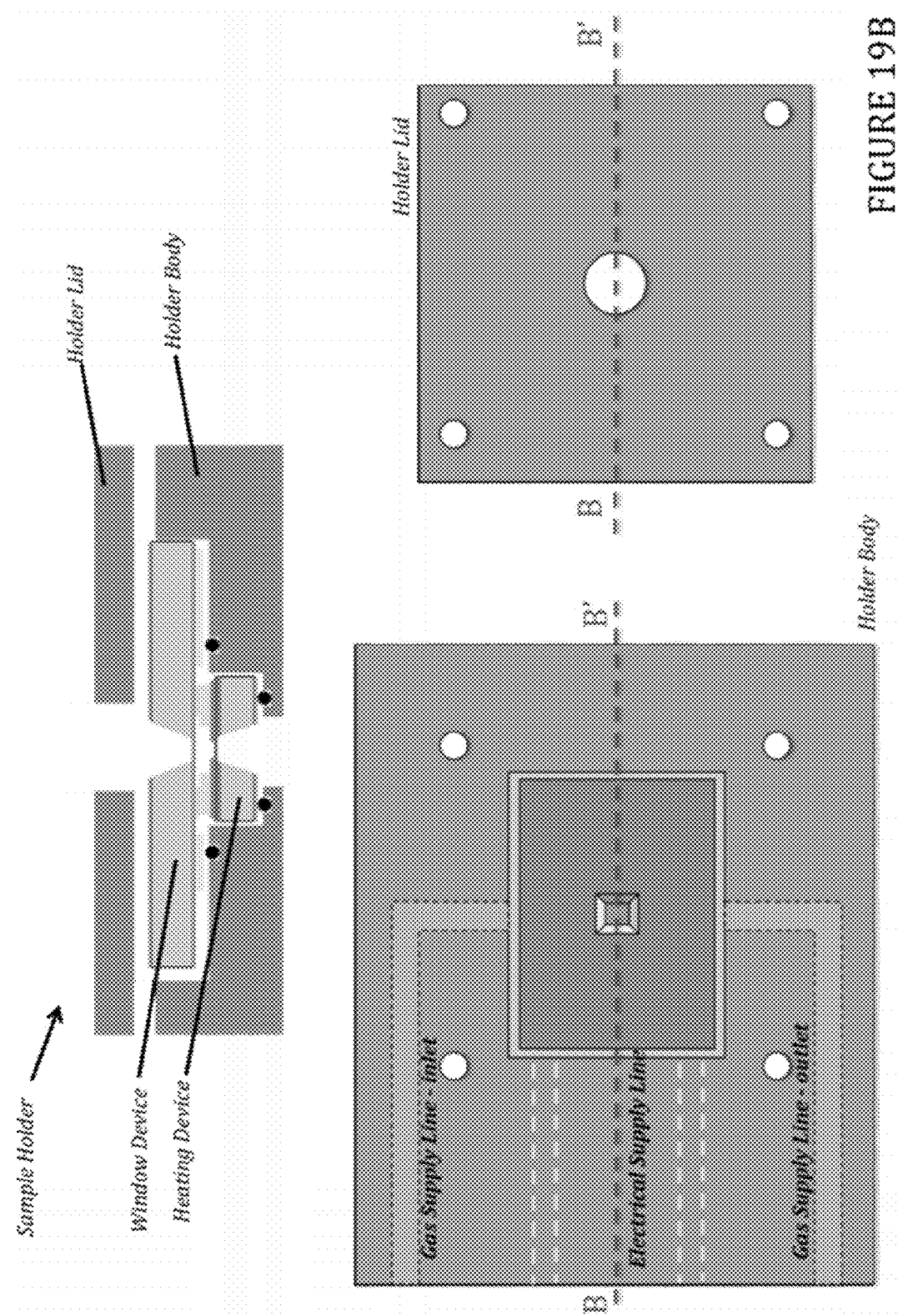
FIG. 19B shows the loading of the alternate generic window device of FIG. 15 in the holder body.
Figure 19C:
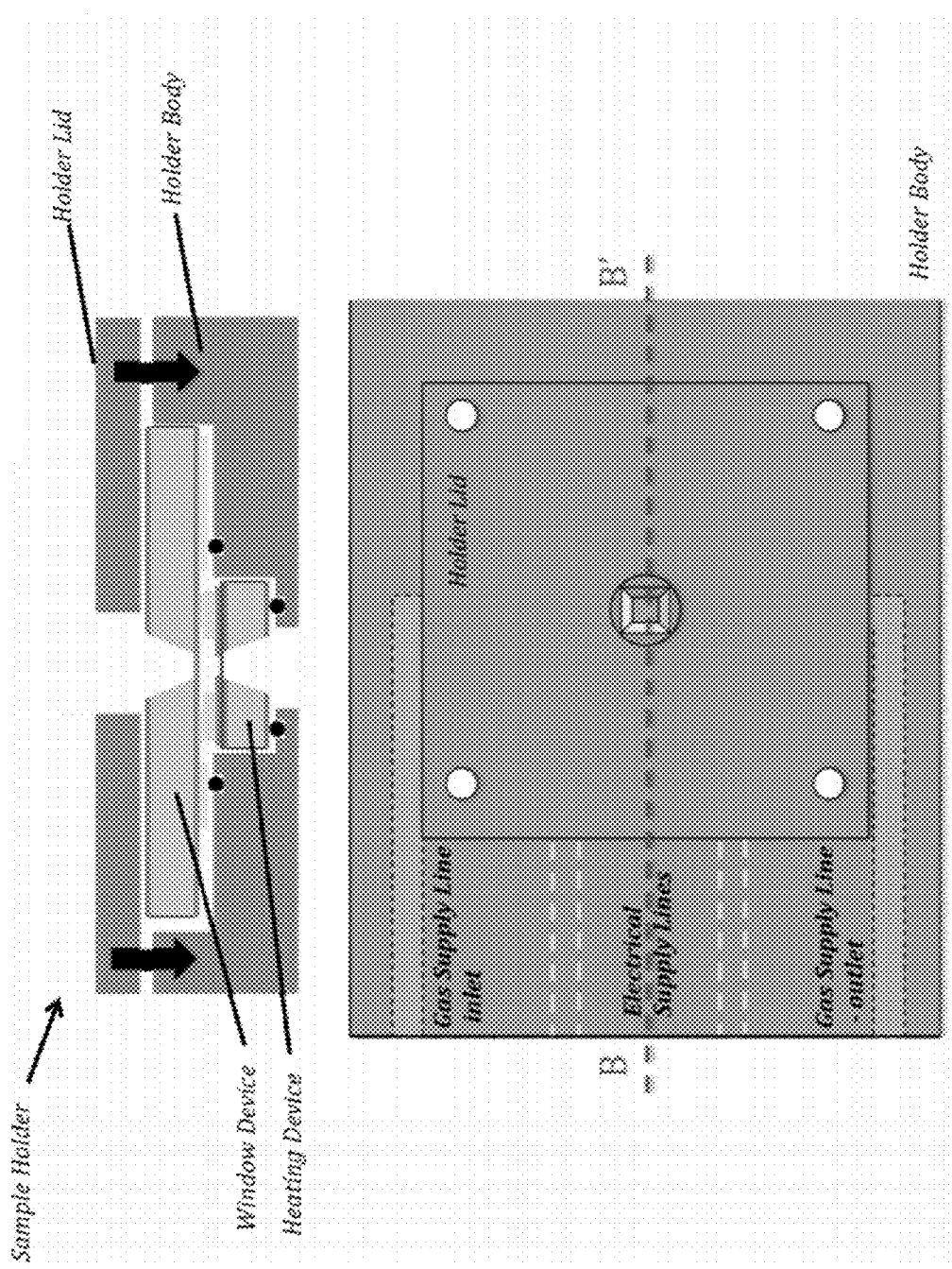
FIG. 19C shows the positioning of the holder lid on the holder body comprising the window device and the electrical device.

FIGS. 19A-19C show cross-sectional and plan view schematics of the gas or electrochemical cell holder and demonstrate how devices are loaded into the sample holder, how electrical contacts are formed, and how the environment inside the cell is maintained.

FIG. 19A shows a thermal device loaded into the holder body for illustrative purposes to form a thermal cell. Alternatively, an electrical device could be loaded to form an electrochemical cell. The device is placed in the deep pocket with the gold contact pads facing up and the etched cavity in the substrate facing down. The bottom of the device sits on the o-ring or other sealing means surrounding the hole in the deep pocket, and a continuous seal is formed around the hole when pressure is applied and the o-ring is compressed between the holder body and the device. The top of the window device is at roughly at the same height as the bottom plane of the shallow pocket. A second o-ring is placed at the bottom of the shallow pocket surrounding the thermal device.

FIG. 19B shows the window device loaded into the holder body for illustrative purposes. The device is placed in the shallow pocket with the thin membrane region facing down (i.e., facing the underlying window device) and the etched cavity in its substrate facing up. The window device sits atop the gold contact pad features on the thermal device and atop the o-ring that surrounds the thermal device. The gold contact pads on the thermal device are aligned with the contact areas on the window device, and the electrodes on the window device are aligned with contact points on the holder body.

FIG. 19C shows the final assembly of the thermal cell holder for illustrative purposes. The holder lid is placed atop the holder body and affixed to the holder body using more than one screw. The depth of the deep and shallow pockets determines the amount of compression on the o-rings or other sealing means that surround the hole in the holder body and the deep pocket in the holder body. Adequate compression is required to form a tight seal around these features and prevent gases or liquids from escaping around the devices. Attaching the holder lid pushes down on the device stack, compressing these o-rings or other sealing means and forming a seal. Adequate compression force the gold contact pads on the thermal device on to the contact areas on the window device, and will also force the electrodes on the window device on to the underlying contact points, forming electrical contacts. The distance between the devices is set by the thickness of the contact pads on the thermal device and this distance does not change when the devices are pushed together when sealing the cell.

A liquid cell holder comprising two window devices will have the same features as the electrochemical cell holder and the thermal cell holder with the exception that there can be one deep pocket in the holder of FIG. 7 because the length and width of the two window devices are substantially identical. Moreover, there is no need for electrical contacts. It should be appreciated that one or both of the window devices may have spacer material thereon. An example of a liquid cell holder can be seen in FIGS. 10 and 11, which will be described at length hereinbelow.

In practice, liquids or gases can be flowed in and out of the liquid, electrochemical or thermal cells described herein through the supply lines without leaking to the outside environment. Electrical current and voltage can be supplied to the electrical or thermal device through the electrical supply lines. The holder can be placed in a TEM, the liquid, electrical or thermal device can be set to the desired current/voltage, and the type of liquid/liquids/gas/gases can be set applied to the sample using the supply lines. During imaging, the electron beam passes through the hole in the holder lid, strikes the sample on the heating membrane of the upper (window, thermal or electrical) device, passes through the window on the lower (window) device, then exits the gas cell through the hole on the bottom of the holder body.

As discussed hereinabove, alignment of the two devices is critical. The membrane region of the window and electrical or thermal devices is preferably narrow so that the windows do not substantially distend when differential pressure is applied (atmospheric pressure inside the cell, vacuum outside the cell). Accordingly, the windows must be well-aligned since the electron beam can pass through the cell only where the windows are aligned. Narrow windows offer less area and therefore provide less margin for error with respect to alignment, so features that improve chip alignment are useful.

Figure 10:
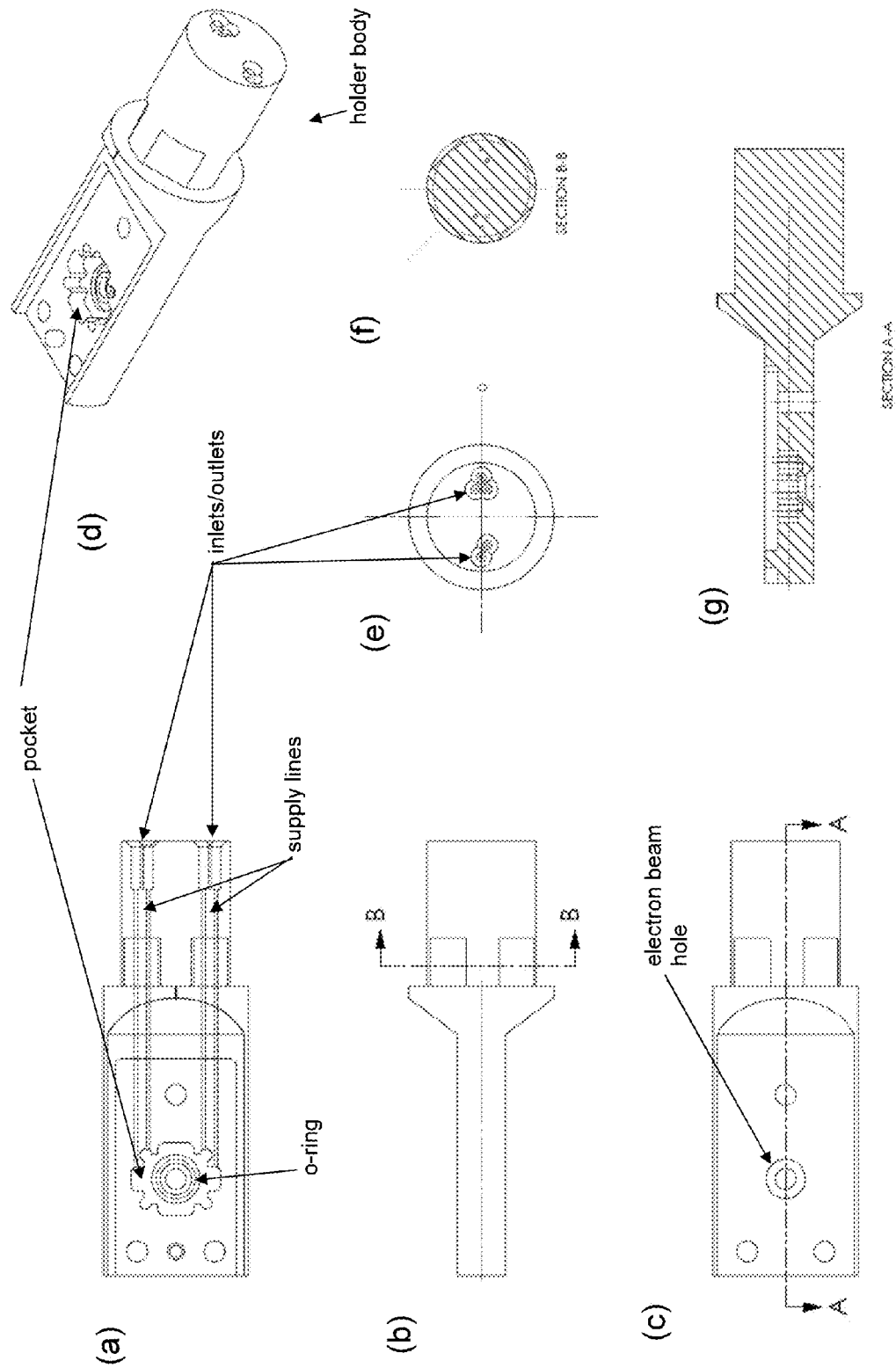
FIG. 10 shows a sample holder body for forming a liquid cell, wherein (a) is a top view of the holder, (b) is a side view of the holder, (c) is a bottom view of the holder, (d) an end view of the holder, (e) a cross-section of the holder at B-B, (f) a cross-section of the holder at A-A, and (g) a three-dimensional view of the holder.
Figure 12:
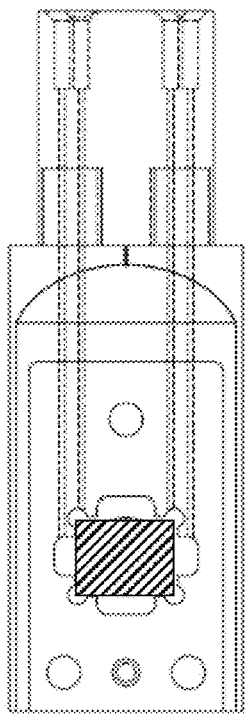
FIG. 12 shows the sample holder of FIG. 10(a) having a device positioned therein.
Figure 13:
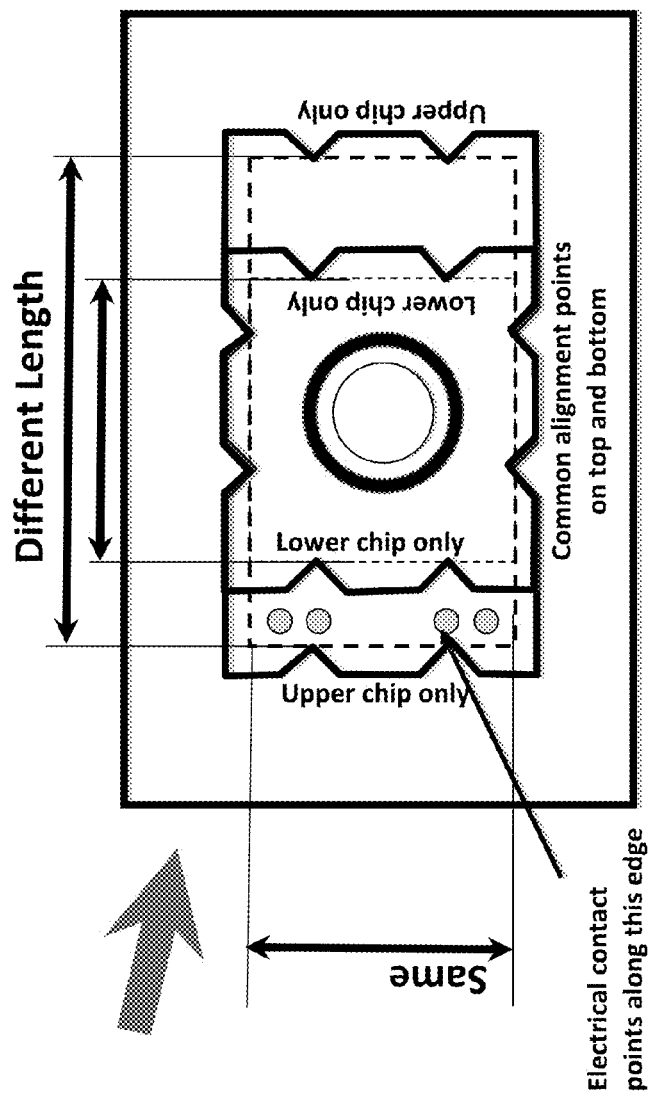
FIG. 13 shows another embodiment of the sample holder body pocket wherein the lower device has a smaller width than the upper device.

Towards that end, another aspect of the present invention is a cell holder having a pocket(s) having contact points rather than straight edge walls so as to improve alignment of the devices in the cell holders. Referring to FIG. 10(d), an example of said pocket in a liquid cell holder body is illustrated. FIG. 10(a) shows a top view of the holder of FIG. 10(d) wherein the pocket has two contact points for each wall of the device(s), as shown more clearly in FIG. 12, where the hatched rectangle is intended to correspond to a device, e.g., window device, as described herein, having four straight edges. Having two contact points for each edge of the device reduces the likelihood that debris in the pocket can impact the device alignment. When the pocket accommodates two equally sized devices (e.g., for the liquid cell), the vertical contact points extend the full depth of the cavity, so the two chips see the same contact points and are therefore aligned to each other. It should be appreciated that the liquid cell holder of FIGS. 10(*a*) and (*d*) has two contact points for each edge, however, the pocket can have at least one straight edge so long as at least one edge includes the contact points illustrated in FIGS. 10(*a*) and (*d*). Another embodiment of the pocket is shown in FIG. 13, wherein the pocket accommodates two different sized devices (e.g., a window device with an electrical or a thermal device). In the embodiment of FIG. 13, both devices, having the same width, share width contact points on opposite edges while the length contact points are unique for each device. It should be appreciated that the contact points can be tooled to be any shape (e.g., hemispherical, square, triangular, etc.) or size as readily determinable by the skilled artisan.

Figure 11:
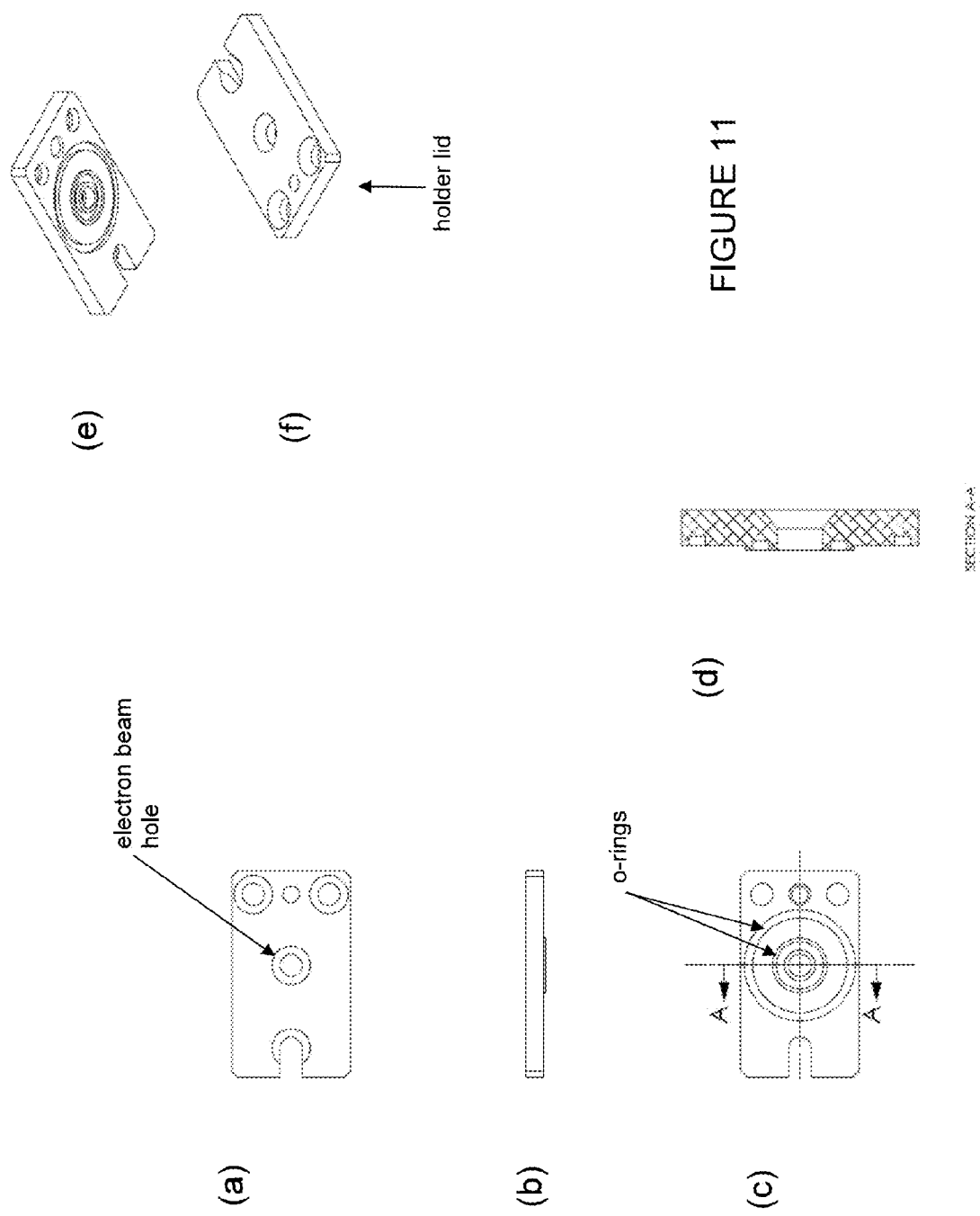
FIG. 11 shows a sample holder lid for forming a liquid cell, wherein (a) is a top view of the lid, (b) is a side view of the lid, (c) is a bottom view of the lid, (d) a cross-section of the lid at A-A, (e) a three-dimensional view of the bottom of the lid, and (f) a three-dimensional view of the top of the lid.

The liquid cell holder body of FIG. 10 correspondingly mates with the liquid cell holder lid of FIG. 11 and the two together make up the sample holder, e.g., as illustrated in FIGS. 5-7. The sample holder can be attached to the barrel (200) of FIG. 1. Moreover, as illustrated in FIGS. 10(*e*) and 10(*f*), multiple input/output ports are illustrated. It should be appreciated that only one input and only one output hole is contemplated. Further, the electrochemical cell holder and the thermal cell holders described herein (e.g., FIGS. 7, 8A-8C and 9A-9C) which are shown as having straight edge pockets preferably include at least one edge having the contact points of FIG. 10(*a*), 10(*d*), or 13, and most preferably, all of the edges include contact points.

Figure 14:
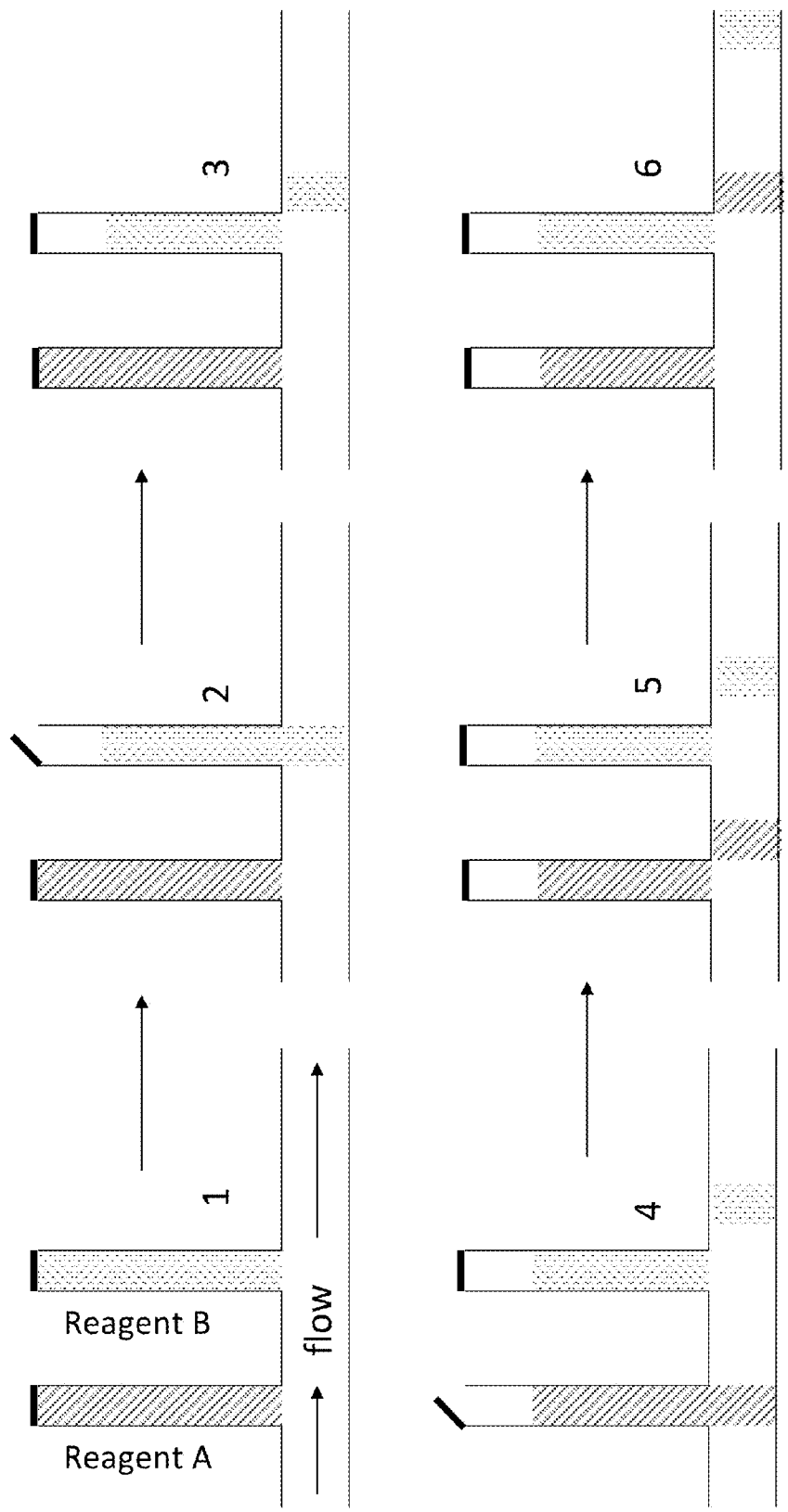
FIG. 14 generically shows the benefit of multiple inputs/outputs to the sample holder in order to introduce multiple reagents.

In another aspect, the use of multiple inputs/outputs to the sample holder in order to introduce multiple reagents during use is described. This allows the user to image chemicals as they mix/react in real time within the cell. It also improves time resolution since a chemical can be loaded, then released at a precise moment into the cell. For example, if a live cell is being imaged, the user can watch the live cell in flowing liquid, then introduce a fixative through a second input to instantaneously fix the cell. Alternatively, two different liquids can be input from either side of the liquid cell, react in the cell (between the windows), then released from a common output. A schematic of the multiple input/output teaching is illustrated in FIG. 14. It should be appreciated that the liquid cell, thermal cell, or electrochemical cell described herein can have one input and one output or any combination of multiple inputs/outputs as readily determined by the skilled artisan.

The cell holders and lids described herein are preferably titanium or brass and are died to guarantee very vertical and parallel pocket edges.

In practice, the first device (e.g., a window device, a heating device or an electrical biasing device) is loaded into the holder body, followed by the place of a sample on the membrane of the first device, the placement of a second device (e.g., a window device, a heating device or an electrical biasing device) in the holder body, and the placement of the holder lid over the holder body comprising the first and second devices and the sample. The holder lid can be secured to the holder body using at least one screw or other fastening means. The electrochemical cell holder is inserted into the electron microscope and the sample can be imaged in a liquid or gas environment using the holder described herein.

In another aspect, a method of imaging a sample in a liquid and/or gaseous environment in an electron microscope is described, said method comprising inserting a sample in a sample holder, inserting the sample holder comprising the sample in an electron microscope, introducing a liquid and/or gas to the sample in the sample holder, and imaging the sample in the liquid and/or gaseous environment, wherein the sample holder comprises a sample holder body and a sample holder lid, wherein the sample holder body comprises at least one pocket having a pocket bottom and pocket walls for the positioning of two microelectronic devices therein, and the sample lid has a top side and a bottom side, as described herein. It should be appreciated that the two microelectronic devices may be the same as or different from one another and can comprise a device selected from the group consisting of a window device, a heating device, a electrical biasing device, and combinations thereof.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

The invention claimed is:

1. A sample holder for an electron microscope, said sample holder comprising a sample holder body and a sample holder lid, wherein the sample holder body comprises a deep pocket having a deep pocket bottom and deep pocket walls for the positioning of a first microelectronic device therein and a shallow pocket having a shallow pocket bottom and shallow pocket walls for the positioning of a second microelectronic device therein, wherein the shallow pocket fully encloses the deep pocket and wherein at least one electrical contact point is positioned on the shallow pocket bottom.

2. The sample holder of claim 1, wherein the sample holder body and the sample holder lid have a hole for passage of an electron beam through the sample holder.

3. The sample holder of claim 1, wherein the sample holder body comprises at least one component selected from the group consisting of:
 (a) at least one inlet supply line;
 (b) at least one outlet supply line;
 (c) at least one sealing means;
 (d) securing means for securing the sample holder lid to the sample holder body; and
 (e) combinations of (a)-(d) thereof.

4. The sample holder of claim 1, wherein the sample holder lid comprises at least one component selected from the group consisting of:
 (a) at least one sealing means;
 (b) securing means for securing the sample holder lid to the sample holder body; and
 (c) combinations of (a) and (b) thereof.

5. The sample holder of claim 3, wherein the sealing means comprises an o-ring.

6. The sample holder of claim 3, wherein the securing means comprise screws.

7. The sample holder of claim 3, wherein a first sealing means is positioned at the deep pocket bottom and surrounds a deep pocket bottom hole such that a seal is formed around the deep pocket bottom hole when pressure is applied to the first and second microelectronic devices.

8. The sample holder of claim 1, wherein the sample holder lid covers the sample holder body, and wherein the sample holder lid has a greater depth above the shallow pocket length and width such that the greater depth of the sample holder lid can be inserted into the shallow pocket for better alignment.

9. The sample holder of claim 1, wherein the first microelectronic device comprises a window device.

10. The sample holder of claim 1, wherein the first and second microelectronic devices are aligned so that the electron beam passes through the sample holder having the microelectronic devices therein.

11. The sample holder of claim 1, wherein the second microelectronic device comprises a thermal device or an electrical biasing device.

12. The sample holder of claim 1, wherein the length and width of the second microelectronic device is greater than the length and width of the first microelectronic device.

13. The sample holder of claim 8, wherein a second sealing means is positioned in the sample holder lid and surrounds a sample holder lid hole such that a seal is formed around the sample holder lid hole when pressure is applied to the first and second microelectronic devices.

14. The sample holder of claim 11, wherein at least one contact pad on the second microelectronic device is aligned with the at least one electrical contact point positioned on the shallow pocket bottom.

15. A method of imaging a sample in a liquid and/or gaseous environment in an electron microscope, said method comprising inserting a sample in a sample holder, inserting the sample holder comprising the sample in an electron microscope, introducing a liquid and/or gas to the sample in the sample holder, and imaging the sample in the electron microscope, wherein the sample holder comprises a deep pocket having a deep pocket bottom and deep pocket walls for the positioning of a first microelectronic device therein and a shallow pocket having a shallow pocket bottom and shallow pocket walls for the positioning of a second microelectronic device therein, wherein the shallow pocket fully encloses the deep pocket and wherein at least one electrical contact point is positioned on the shallow pocket bottom.

16. The method of claim 15, wherein the first microelectronic device comprises a window device.

17. The method of claim 15, wherein the second microelectronic device comprises a heating device or an electrical biasing device.

18. The method of claim 15, wherein the sample holder lid covers the sample holder body, and wherein the sample holder lid has a greater depth above the shallow pocket length and width such that the greater depth of the sample holder lid can be inserted into the shallow pocket for better alignment.

19. The method of claim 15, wherein a second sealing means is positioned in the sample holder lid and surrounds a sample holder lid hole such that a seal is formed around the sample holder lid hole when pressure is applied to the first and second microelectronic devices, and wherein a first sealing means is positioned at the deep pocket bottom and surrounds a deep pocket bottom hole such that a seal is formed around the deep pocket bottom hole when pressure is applied to the first and second microelectronic devices.

20. The method of claim 19, wherein the first microelectronic device is a window device and the second microelectronic device is a thermal device or an electrical biasing device, and wherein attaching the sample holder lid to the sample holder body results in (a) the compression of the first and second sealing means thus forming a seal and (b) the formation of an electrical contact between the at least one contact point positioned on the shallow pocket bottom and at least one contact pad on the second microelectronic device.

21. The sample holder of claim 1, wherein the first microelectronic device is a window device and the second microelectronic device is a thermal device or an electrical biasing device, wherein a first sealing means is positioned at the deep pocket bottom and surrounds a deep pocket bottom hole and a second sealing means is positioned in the sample holder lid and surrounds a sample holder lid hole, and wherein attaching the sample holder lid to the sample holder body results in (a) the compression of the first and second sealing means thus forming a seal and (b) the formation of an electrical contact between the at least one contact point positioned on the shallow pocket bottom and at least one contact pad on the second microelectronic device.

* * * * *